US012787265B2

(12) United States Patent
Sun et al.

(10) Patent No.: US 12,787,265 B2
(45) Date of Patent: Nov. 3, 2026

(54) MANAGING VERTICAL STRUCTURES IN THREE-DIMENSIONAL SEMICONDUCTIVE DEVICES

(71) Applicant: Yangtze Memory Technologies Co., Ltd., Wuhan (CN)

(72) Inventors: Chao Sun, Wuhan (CN); Ning Jiang, Wuhan (CN); Wei Liu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 403 days.

(21) Appl. No.: 18/488,689

(22) Filed: Oct. 17, 2023

(65) Prior Publication Data

US 2025/0081447 A1 Mar. 6, 2025

Related U.S. Application Data

(63) Continuation of application No. PCT/CN2023/117148, filed on Sep. 6, 2023.

(51) Int. Cl.
*H10B 12/00* (2023.01)
*G11C 5/06* (2006.01)

(52) U.S. Cl.
CPC ........... *H10B 12/488* (2023.02); *G11C 5/063* (2013.01); *H10B 12/315* (2023.02)

(58) Field of Classification Search
CPC .... H10B 12/488; H10B 12/315; H10B 12/05; H10B 12/34; G11C 5/063; H10D 30/6728
See application file for complete search history.

(56) References Cited

U.S. PATENT DOCUMENTS 12,501,605 B2 * 12/2025 Yoon ...................... H10B 12/03
2018/0069117 A1 * 3/2018 Cho ...................... H10B 12/053
2019/0252553 A1 * 8/2019 Liu ...................... H10D 30/025
2023/0133595 A1 * 5/2023 Yang ...................... H01L 25/50 257/296
2024/0206148 A1 * 6/2024 Zhang .................... H10B 43/27

OTHER PUBLICATIONS

International Search Report in International Appln. No. PCT/CN2023/117148, mailed on Mar. 4, 2024, 4 pages.
Communication pursuant to Article 94(3) EPC in European Appln. No. 23792865.0, mailed on Mar. 16, 2026, 12 pages.

* cited by examiner

*Primary Examiner* — Mamadou L Diallo
(74) *Attorney, Agent, or Firm* — Fish & Richardson P.C.

(57) ABSTRACT

Systems, devices, and methods for managing vertical structures in three-dimensional (3D) semiconductor devices are provided. In one aspect, a semiconductor device includes two adjacent memory cells and a conductive structure between the two adjacent memory cells. Each of the two adjacent memory cells includes a transistor having a semiconductor body, a first terminal, a second terminal, and a gate terminal. The conductive structure is in contact with at least one of semiconductor bodies of the transistors of the two adjacent memory cells, and the conductive structure is spaced from the first terminal and the second terminal of each of the transistors of the two adjacent memory cells.

20 Claims, 23 Drawing Sheets

MANAGING VERTICAL STRUCTURES IN THREE-DIMENSIONAL SEMICONDUCTIVE DEVICES

CROSS-REFERENCE TO RELATED APPLICATIONS

This application is a continuation of International Application No. PCT/CN2023/117148, filed on Sep. 6, 2023, the disclosure of which is hereby incorporated by reference in its entirety.

TECHNICAL FIELD

The present disclosure relates to semiconductor devices and fabrication processes for semiconductor devices.

BACKGROUND

Semiconductor devices, e.g., memory devices, can have various structures to increase a density of memory cells and lines on a chip. For example, three-dimensional (3D) memory devices are attractive due to their capability to increase an array density by stacking more layers within a similar footprint. A 3D memory device normally includes a memory array of memory cells and peripheral circuits for facilitating operations of the memory array. The memory cells can include vertical structures, e.g., vertical transistors.

SUMMARY

The present disclosure describes methods, devices, systems and techniques for managing vertical structures in three-dimensional (3D) semiconductor devices.

One aspect of the present disclosure features a semiconductor device including: two adjacent memory cells, where each of the two adjacent memory cells includes a transistor having a semiconductor body, a first terminal, a second terminal, and a gate terminal; and a conductive structure between transistors of the two adjacent memory cells, the conductive structure being in contact with at least one of semiconductor bodies of the transistors of the two adjacent memory cells. The conductive structure is spaced from the first terminal and the second terminal of each of the transistors of the two adjacent memory cells.

In some implementations, a working function of the conductive structure is higher than a working function of a semiconductor body in contact with the conductive structure.

In some implementations, the conductive structure is configured such that a Schottky barrier is formed at an interface between the conductive structure and a semiconductor body in contact with the conductive structure.

In some implementations, the conductive structure is coupled to a fixed voltage.

In some implementations, the conductive structure is coupled to a fixed voltage, such that, in operation, a current path is formed from the semiconductor body to the conductive structure.

In some implementations, the fixed voltage is a negative voltage.

In some implementations, the fixed voltage is associated with a threshold voltage of at least one of the two adjacent memory cells.

In some implementations, the conductive structure includes one or more conductive layers that comprise at least one of a metallic layer, a polysilicon layer, a germanium-silicon (GeSi) layer, or a barrier layer.

In some implementations, the conductive structure is contact with each of the semiconductor bodies of the transistors of the two adjacent memory cells.

In some implementations, the semiconductor body includes opposite ends along a first direction and opposite sides along a second direction perpendicular to the first direction. The first terminal and the second terminal are at the opposite ends of the semiconductor body along the first direction, respectively. The gate terminal and the conductive structure are at two opposite sides of the semiconductor body, respectively.

In some implementations, the conductive structure is in contact with at least one of: a first part of the semiconductor body closer to the first terminal than the second terminal, a second part of the semiconductor body closer to the second terminal than the first terminal, a middle part of the semiconductor body between the first part and the second part, or the first part, the second part, and the middle part of the semiconductor body.

In some implementations, the conductive structure has a first part along the first direction and a second part crossing with the first part along the second direction. The second part of the conductive structure is in contact with the each of the semiconductor bodies of the transistors of the two adjacent memory cells.

In some implementations, the first part of the conductive structure extends along the first direction and spaced from the first and second terminals of the transistors along the second direction.

In some implementations, the conductive structure includes conductive bars spaced along the first direction, each of the conductive bars being in contact with the at least one of the semiconductor bodies along the second direction.

In some implementations, the conductive structure includes two conductors that are spaced from each other along the second direction, each of the two conductors being in contact with a respective one of the semiconductor bodies of the transistors of the two adjacent memory cells.

In some implementations, the two conductors are coupled together to a same voltage source.

In some implementations, the conductive structure comprises an oval shape having edges in contact with the at least one of the semiconductor bodies along the second direction.

In some implementations, the semiconductor device further includes: two word lines spaced along the second direction, where each of the two word lines is coupled to a respective memory cell of the two adjacent memory cells, each word line extends in a third direction perpendicular to the first direction and the second direction, and two rows of memory cells, and each row of memory cells extends along the third direction and is coupled to a respective word line of the two word lines.

In some implementations, the conductive structure extends along the third direction and has opposite sides along the second direction. The two rows of memory cells are coupled to the opposite sides of the conductive structure, respectively.

In some implementations, the conductive structure includes: a first part extending along the third direction and being coupled to semiconductor bodies of the two rows of the memory cells along the second direction, and one or more second parts extending along the second direction, each of the one or more second parts being between adjacent semiconductor bodies along the third direction.

In some implementations, the conductive structure comprises a first conductor and a second conductor spaced from each other along the second direction. The first conductor is coupled to a first row of the two rows of memory cells, and the second conductor is coupled to a second row of the two rows of memory cells.

In some implementations, the first conductor includes: a first part extending along the third direction and being coupled to semiconductor bodies of the first row of the two rows of the memory cells along the second direction, and one or more second parts extending along the second direction, each of the one or more second parts being between adjacent semiconductor bodies along the third direction. The second conductor includes: a third part extending along the third direction and being coupled to semiconductor bodies of the second row of the two rows of the memory cells along the second direction, and one or more fourth parts extending along the second direction, each of the one or more fourth parts being between adjacent semiconductor bodies along the third direction.

In some implementations, the conductive structure includes a plurality of conductors spaced from one another along the third direction. Each of the plurality of conductors is in coupled to corresponding adjacent memory cells along the second direction.

In some implementations, each of the word lines is coupled to a first connection structure located relatively closer to a first memory cell of a respective row of memory cells than a last memory cell of the respective row of memory cells along the third direction. The conductive structure is coupled to a second connection structure located relatively closer to the last memory cell of the respective row of memory cells than the first memory cell of the respective row of memory cells.

In some implementations, the semiconductor structure further includes: a plurality of conductive lines comprising the two word lines and the conductive structure, each of the plurality of conductive lines extending along the third direction. Adjacent conductive lines of the plurality of conductive lines are spaced from one another along the second direction and are coupled to respective connection structures that are at opposite ends of rows of memory cells extending along the third direction.

In some implementations, the semiconductor structure further includes a semiconductor substrate having first and second opposite sides. Each of the word lines is coupled to a first connection structure located at the first side of the semiconductor substrate. The conductive structure is coupled to a second connection structure located at the second side of the semiconductor substrate.

In some implementations, each of the two adjacent memory cells includes a respective storage unit coupled to the first terminal of the transistor of the memory cell. The semiconductor device further comprises a bit line coupled to second terminals of the transistors of the two adjacent memory cells, the bit line extending along the second direction.

In some implementations, the transistors of the two adjacent memory cells are mirror-symmetric with respect to the conductive structure.

Another aspect of the present disclosure features a method of forming a semiconductor device, including: forming two adjacent memory cells in a semiconductor substrate, where each of the two adjacent memory cells comprises a transistor having a semiconductor body, a first terminal, a second terminal, and a gate terminal; and forming a conductive structure between transistors of the two adjacent memory cells, the conductive structure being in contact with at least one of semiconductor bodies of the transistors of the two adjacent memory cells. The conductive structure is spaced from the first terminal and the second terminal of each of the transistors of the two adjacent memory cells.

In some implementations, the method further includes: forming a first conductive line coupled to the gate terminal of the transistor of a first memory cell of the two adjacent memory cells; forming a second conductive line coupled to the gate terminal of the transistor of a second memory cell of the two adjacent memory cells; coupling the first conductive line and the second conductive line to respective first connection structures; and coupling the conductive structure to a second connection structure. The respective first connection structures and the second connection structure are separately arranged at opposite ends of the transistors or on opposite sides of the semiconductor substrate.

In some implementations, the two adjacent memory cells and the conductive structure are formed in a same side of the semiconductor substrate.

In some implementations, forming the two adjacent memory cells in the semiconductor substrate includes: forming the two adjacent memory cells from a first side of the semiconductor substrate. Forming the conductive structure includes: forming the conductive structure from a second side of the semiconductor substrate, opposite to the first side.

Another aspect of the present disclosure features a system, including: a memory device and a controller coupled to the memory device and configured to control the memory device. In such implementations, the memory device includes: two adjacent memory cells, where each of the two adjacent memory cells comprises a transistor having a semiconductor body, a first terminal, a second terminal, and a gate terminal; and a conductive structure between transistors of the two adjacent memory cells, the conductive structure being in contact with at least one of semiconductor bodies of the transistors of the two adjacent memory cells. The conductive structure is spaced from the first terminal and the second terminal of each of the transistors of the two adjacent memory cells.

In some implementations, the memory device includes: an array of memory cells; a plurality of conductive structures, where each of the plurality of conductive structures is between respective adjacent rows of memory cells and is coupled to semiconductor bodies of the respective adjacent rows of memory cells, each of the plurality of conductive structures is spaced from first and second terminals of transistors of the respective adjacent rows of memory cells; and a plurality of word lines, each of the plurality of word lines is coupled to a respective row of memory cells and at an opposite side of the respective row of memory cells with respect to the conductive structure, and where each word line extends in the second direction.

In some implementations, each of the plurality of word lines is coupled to a first connection structure located relatively closer to a first memory cell of a row of memory cells than a last memory cell of the row of memory cells. Each of the plurality of conductive structures is coupled to a second connection structure located relatively closer to the last memory cell of the row of memory cells than the first memory cell of the row of memory cells.

In some implementations, each of the plurality of word lines is coupled to a first connection structure located relatively closer to a first surface of the array of memory cells than a second surface of the row of memory cells that is different from the first surface. Each of the plurality of conductive structures is coupled to a second connection structure located relatively closer to the second surface cell of the array of memory cells than the first surface of the array of memory cells.

In some implementations, the system further includes: a plurality of bit lines, where each of the plurality of bit lines is coupled to first terminals of transistors of a column of memory cells. Each memory cell of the column of memory cells comprises a storage unit coupled to a second terminal of a corresponding transistor of the memory cell.

Another aspect of the present disclosure features a semiconductor device including: two adjacent semiconductor bodies; a conductive structure between the two adjacent semiconductor bodies, the conductive structure being in contact with at least one of the two adjacent semiconductor bodies, and two conductive lines on opposite sides of the conductive structure. Each of the two conductive lines is coupled to a respective connection structure at an end of the conductive line. The conductive structure is coupled to a corresponding connection structure at an end of the conductive structure. Two adjacent of the respective connection structures coupled to the two conductive lines and the corresponding connection structure coupled to the conductive structure are at: at least one of opposite ends on a same side of the semiconductor device or opposite sides of the semiconductor device.

Implementations of the present disclosure can provide one or more of the following technical advantages and/or benefits. By using a conductive structure between two adjacent memory cells, charges build-up in the floating body region of the transistors can be reduced, thereby mitigating the floating body effect in the memory cells. By applying a fixed negative voltage on the conductive structure between the memory cells, a threshold voltage of the memory cells can be conveniently adjusted, reducing the overall manufacturing complexity and cost, and improving reliability of the memory cells. Moreover, by arranging connection structures alternatively on different ends of respective word lines and conductive structures, and/or arranging the connection structures of the word lines and connection structures of the conductive structures on opposite sides of the semiconductor structure, the overall manufacturing complexity of the semiconductor structure can be reduced.

The techniques can be applied to various types of semiconductor devices, volatile memory devices, such as DRAM memory devices, or non-volatile memory (NVM) devices, such as NAND flash memory, NOR flash memory, resistive random-access memory (RRAM), phase-change memory (PCM) such as phase-change random-access memory (PCRAM), spin-transfer torque (STT)-Magnetoresistive random-access memory (MRAM), among others. The techniques can also be applied to charge-trapping based memory devices, e.g., silicon-oxide-nitride-oxide-silicon (SONOS) memory devices, and floating-gate based memory devices. The techniques can be applied to three-dimensional (3D) memory devices. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, among others.

The details of one or more implementations of the subject matter of this present disclosure are set forth in the accompanying drawings and the description below. Other features, aspects, and advantages of the subject matter will become apparent from the description, the drawings, and the claims.

BRIEF DESCRIPTION OF THE DRAWINGS

The accompanying drawings, which are incorporated herein and form a part of the present disclosure, illustrate aspects of the present disclosure and, together with the description, further serve to explain the principles of the present disclosure and to enable a person of ordinary skill in the pertinent art to make and use the present disclosure.

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1:
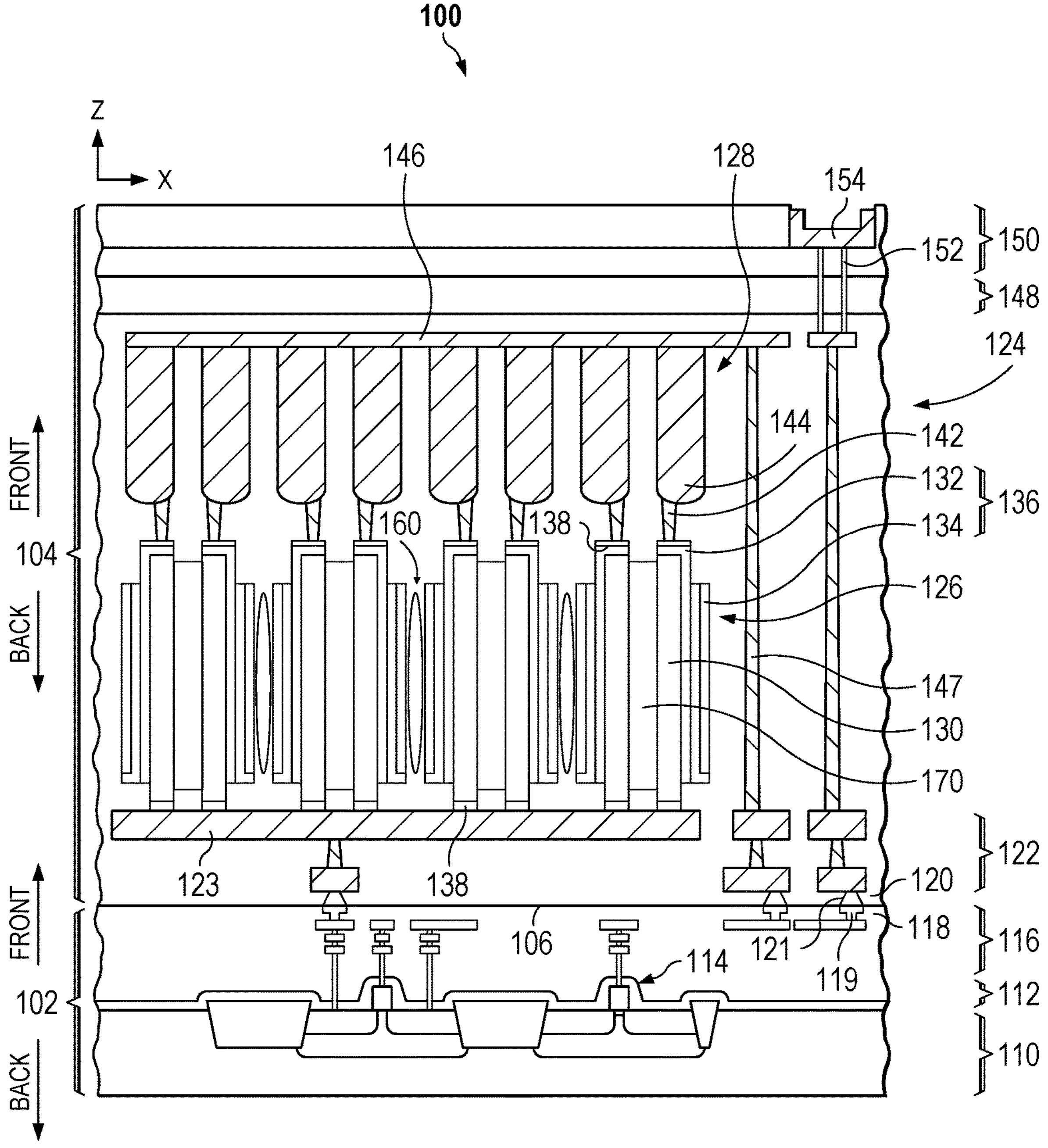
FIG. 1 illustrates a cross-sectional view of an example 3D semiconductor device.

FIG. 1 illustrates a side view of a cross-section of an example 3D semiconductor device 100. The 3D semiconductor device 100 can be a 3D dynamic random-access memory (DRAM). It is understood that FIG. 1 is for illustrative purposes only and may not necessarily reflect the actual device structure (e.g., interconnections) in practice. In some implementations, the 3D semiconductor device 100 is a bonded chip including a first semiconductor structure 102 and a second semiconductor structure 104 stacked over the first semiconductor structure 102. The first and second semiconductor structures 102 and 104 can be jointed at bonding interface 106 therebetween.

As shown in FIG. 1, the first semiconductor structure 102 can include a substrate 110, which can include silicon (e.g., single crystalline silicon, c-Si), SiGe, GaAs, Ge, SOI, or any other suitable materials. The first semiconductor structure 102 can include peripheral circuits 112 on and/or in the substrate 110. In some implementations, the peripheral circuits 112 include a plurality of transistors 114 (e.g., planar transistors and/or 3D transistors). Trench isolations (e.g., shallow trench isolations (STIs)) and doped regions (e.g., wells, sources, and drains of transistors 114) can be formed on or in the substrate 110 as well. In some examples, the peripheral circuits 112 are formed using complementary metal-oxide-semiconductor (CMOS) technology, and the first semiconductor structure 102 can be also formed on a semiconductor die that can be referred to as a control die or a CMOS die 102.

In some implementations, the first semiconductor structure 102 further includes an interconnect layer 116 above the peripheral circuits 112 to transfer electrical signals to and from the peripheral circuits 112. The interconnect layer 116 can include a plurality of interconnects (also referred to herein as "contacts"), including lateral interconnect lines and VIA contacts. The interconnect layer 116 can further include one or more interlay dielectric (ILD) layers in which the interconnect lines and via contacts can form. That is, the interconnect layer 116 can include interconnect lines and via contacts in multiple ILD layers. In some implementations, peripheral circuits 112 are coupled to one another through the interconnects in the interconnect layer 116. The interconnects in interconnect layer 116 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof.

As shown in FIG. 1, the first semiconductor structure 102 has a front side and a back side, and the first semiconductor structure 102 can further include a bonding layer 118 at the back side at the bonding interface 106 and above the interconnect layer 116 and the peripheral circuits 112. The bonding layer 118 can include a plurality of bonding contacts 119 and dielectrics electrically isolating the bonding contacts 119. The bonding contacts 119 can include conductive materials, such as Cu. The remaining area of the bonding layer 118 can be formed with dielectric materials, such as silicon oxide. The bonding contacts 119 and surrounding dielectrics in the bonding layer 118 can be used for hybrid bonding. Similarly, as shown in FIG. 1, the second semiconductor structure 104 can also include a bonding layer 120 at the bonding interface 106 and above the bonding layer 118 of the first semiconductor structure 102. The bonding layer 120 can include a plurality of bonding contacts 121 and dielectrics electrically isolating the bonding contacts 121. The bonding contacts 121 can include conductive materials, such as Cu. The remaining area of the bonding layer 120 can be formed with dielectric materials, such as silicon oxide. The bonding contacts 121 and surrounding dielectrics in the bonding layer 120 can be used for hybrid bonding. The bonding contacts 121 can be in contact with the bonding contacts 119 at the bonding interface 106. In some implementations, the bonding layer 120 includes a dielectric layer opposing memory cells (e.g., DRAM cells) 124 with a bit line 123 positioned between the dielectric layer and the memory cells 124, as shown in FIG. 1. The dielectric layer can include the bonding interface 106 having the bonding contacts 121.

The second semiconductor structure 104 can be bonded on top of the first semiconductor structure 102 in a face-to-face manner at the bonding interface 106. In some implementations, the bonding interface 106 is disposed between the bonding layers 120 and 118 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, the bonding interface 106 is the place at which bonding layers 120 and 118 are met and bonded. In some examples, the bonding interface 106 can be a layer with a certain thickness that includes the top surface of the bonding layer 118 of the first semiconductor structure 102 and the bottom surface of the bonding layer 120 of the second semiconductor structure 104.

In some implementations, the second semiconductor structure 104 further includes an interconnect layer 122 including bit lines 123 above the bonding layer 120 to transfer electrical signals. The interconnect layer 122 can include a plurality of interconnects, such as mid end of line (MEOL) interconnects and back end of line (BEOL) interconnects. In some implementations, the interconnects in interconnect layer 122 also include local interconnects, such as the bit lines 123 and word line contacts (not shown). The interconnect layer 122 can further include one or more ILD layers in which the interconnect lines and via contacts can form. The interconnects in the interconnect layer 122 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof.

In some implementations, the peripheral circuits 112 include a word line driver/row decoder coupled to the word line contacts in the interconnect layer 122 through the bonding contacts 121 and 119 in the bonding layers 120 and 118 and the interconnect layer 116. In some implementations, the peripheral circuits 112 include a bit line driver/column decoder coupled to the bit lines 123 and bit line contacts in the interconnect layer 122 through the bonding contacts 121 and 119 in the bonding layers 120 and 118 and the interconnect layer 116. In some implementations, the bit line 123 is a metal bit line, as opposed to semiconductor bit lines (e.g., doped silicon bit lines). For example, the bit line 123 may include W, Co, Cu, Al, or any other suitable metals having higher conductivities than doped silicon. In some implementations, the bit line contact is an ohmic contact as opposed to a Schottky contact.

In some implementations, the bit line 123 is made of a composite conductive material that can be based on a metallic material (e.g., W, Co, Cu, Al) and a semiconductor material (e.g., Si). For example, the composite conductive material can include metal silicide, e.g., such as WSi, CoSi, CuSi, AlSi, or any other suitable metal silicides having higher conductivities than doped silicon.

In some implementations, the second semiconductor structure 104 includes a DRAM device in which memory cells are provided in the form of an array of DRAM cells 124 above the interconnect layer 122 and the bonding layer 120. That is, the interconnect layer 122 including the bit lines 123 can be disposed between bonding layer 120 and array of DRAM cells 124. A bit line 123 in the interconnect layer 122 can be coupled to a string of DRAM cells 124. In some implementations, the second semiconductor structure 104 is formed on a semiconductor die and can be referred to as array die 104.

In some implementations, a semiconductor device can include multiple array dies (e.g., the array die 104) and a CMOS die (e.g., the CMOS die 102). The multiple array dies and the CMOS die can be stacked and bonded together. The CMOS die can be respectively coupled to each of the multiple array dies, and can respectively drive each of the multiple array dies to operate in the similar manner as the semiconductor device. The semiconductor device can be any suitable device. In some examples, the semiconductor device includes at least a first wafer and a second wafer bonded face to face. The array die can be disposed with other array dies on the first wafer, and the CMOS die can be disposed with other CMOS dies on the second wafer. The first wafer and the second wafer can be bonded together, thus the array dies on the first wafer can be bonded with corresponding CMOS dies on the second wafer. In some examples, the semiconductor device is a chip with at least the array die and the CMOS die bonded together. In an example, the chip is diced from wafers that are bonded together. In another example, the semiconductor device is a semiconductor package that includes one or more semiconductor chips assembled on a package substrate.

Each DRAM cell 124 can include a vertical transistor 126 and a capacitor 128 coupled to the vertical transistor 126. DRAM cell 124 can be a 1T1C cell consisting of one transistor and one capacitor. It is understood that DRAM cell 124 may be of any suitable configurations, such as 2T1C cell, 3T1C cell, etc. The vertical transistor 126 can be a MOSFET used to switch a respective DRAM cell 124. In some implementations, the vertical transistor 126 includes a semiconductor body 130 (the active region in which a channel can form) extending vertically (in the z-direction), and a gate structure 136 in contact with one side of semiconductor body 130. In a single-gate vertical transistor, the semiconductor body 130 can have a cuboid shape or a cylinder shape, and the gate structure 136 can abut a single side of semiconductor body 130 in a plane view, e.g., as shown in FIG. 1. In some implementations, the vertical transistor 126 has a structure including two or more gates, e.g., a two-gates structure, a three-gates structure, or a gate all around (GAA) structure. In some implementations, the gate structure 136 includes a gate electrode 134 and a gate dielectric 132 laterally between the gate electrode 134 and the semiconductor body 130 in a bit line direction (e.g., in the Y direction). In some implementations, the gate dielectric 132 abuts one side of the semiconductor body 130, and the gate electrode 134 abuts the gate dielectric 132.

As shown in FIG. 1, in some implementations, the semiconductor body 130 has two ends (the upper end and lower end in FIG. 1) in the vertical direction (the z-direction), and at least one end (e.g., the lower end) extends beyond gate dielectric 132 in the vertical direction (the z-direction) into the ILD layers. In some implementations, one end (e.g., the upper end) of the semiconductor body 130 is flush with the respective end (e.g., the upper end) of the gate dielectric 132. In some implementations, both ends (the upper end and lower end) of the semiconductor body 130 extend beyond the gate electrode 134, respectively, in the vertical direction (the z-direction) into ILD layers. That is, the semiconductor body 130 can have a larger vertical dimension (e.g., the depth) than that of the gate electrode 134 (e.g., in the z-direction), and neither the upper end nor the lower end of semiconductor body 130 is flush with the respective end of the gate electrode 134. Thus, short circuits between the bit lines 123 and the word lines/gate electrodes 134 or between the word lines/gate electrodes 134 and the capacitors 128 can be avoided. The vertical transistor 126 can further include a source and a drain (both referred to as 138 as their locations may be interchangeable) disposed at the two ends (the upper end and lower end) of the semiconductor body 130, respectively, in the vertical direction (the z-direction). In some implementations, one of the source and drain 138 (e.g., at the upper end in FIG. 1) is coupled to the capacitor 128, and the other one of source and drain 138 (e.g., at the lower end in FIG. 1) is coupled to the bit line 123. That is, the vertical transistor 126 can have a first terminal in the positive z-direction and a second terminal opposite the first terminal in the negative z-direction, as shown in FIG. 1.

In some implementations, the semiconductor body 130 includes semiconductor materials, such as single crystalline silicon, polysilicon, amorphous silicon, Ge, any other semiconductor materials, or any combinations thereof. In one example, semiconductor body 130 may include single crystalline silicon. Source and drain 138 can be doped with N+ type dopants (e.g., Phosphorus (P) or Arsenic (As)) or P-type dopants (e.g., Boron (B) or Gallium (Ga)) at a desired doping level. In some implementations, a silicide layer, such as a metal silicide layer, is formed between source/drain 138 of the vertical transistor 126 and the bit line 123 as the bit line contact or between source/drain 138 of the vertical transistor 126 and the first electrode of the capacitor 128 as capacitor contact 142 to reduce the contact resistance. In some implementations, gate dielectric 132 includes dielectric materials, such as silicon oxide, silicon nitride, or high-k dielectrics including, but not limited to, Al2O3, HfO2, Ta2O5, ZrO2, TiO2, or any combination thereof. In some implementations, gate electrode 134 includes a conductive material including, but not limited to W, Co, Cu, Al, TiN, TaN, polysilicon, silicide, or any combination thereof. In some implementations, the gate electrode 134 includes multiple conductive layers, such as a W layer over a TiN layer. In one example, the gate structure 136 may be a "gate oxide/gate poly" gate in which the gate dielectric 132 includes silicon oxide and gate electrode 134 includes doped polysilicon. In another example, gate structure 136 may be an HKMG in which gate dielectric 132 includes a high-k dielectric and gate electrode 134 includes a metal.

As described above, since the gate electrode 134 may be part of a word line or extend in the word line direction (e.g., the X direction) as a word line, the second semiconductor structure 104 of the 3D semiconductor device 100 can also include a plurality of word lines each extending in the word line direction. Each word line 134 can be coupled to a row of DRAM cells 124. That is, the bit line 123 and the word line 134 can extend in two perpendicular lateral directions, and the semiconductor body 130 of the vertical transistor 126 can extend in the vertical direction perpendicular to the two lateral directions in which the bit line 123 and the word line 134 extend. Word lines 134 are in contact with word line contacts (not shown). In some implementations, the word lines 134 include conductive materials including, but not limited to W, Co, Cu, Al, TiN, TaN, polysilicon, silicides, or any combination thereof. In some implementations, the word line 134 includes multiple conductive layers, such as a W layer over a TiN layer, as shown in FIG. 1.

In some implementations, as shown in FIG. 1, the vertical transistor 126 extends vertically through and contacts the word lines 134, and the source or drain 138 of vertical transistor 126 at the lower end thereof is in contact with the bit line 123 (or bit line contact if any). Accordingly, the word lines 134 and the bit lines 123 can be disposed in different planes in the vertical direction due to the vertical arrangement of vertical transistor 126, which simplifies the routing of the word lines 134 and the bit lines 123. In some implementations, the bit lines 123 are disposed vertically between the bonding layer 120 and the word lines 134, and the word lines 134 are disposed vertically between the bit lines 123 and the capacitors 128. The word lines 134 can be coupled to the peripheral circuits 112 in the first semiconductor structure 102 through word line contacts (not shown) in the interconnect layer 122, the bonding contacts 121 and 119 in the bonding layers 120 and 118, and the interconnects in the interconnect layer 116. Similarly, the bit lines 123 in the interconnect layer 122 can be coupled to the peripheral circuits 112 in the first semiconductor structure 102 through the bonding contacts 121 and 119 in the bonding layers 120 and 118 and the interconnects in the interconnect layer 116.

In some implementations, the vertical transistors 126 can be arranged in a mirror-symmetric manner to increase the density of DRAM cells 124 in the bit line direction (the Y direction). As shown in FIG. 1, two adjacent vertical transistors 126 in the bit line direction are mirror-symmetric to one another with respect to a trench isolation 160. That is, the second semiconductor structure 104 can include a plurality of trench isolations 160 each extending in the word line direction (the X direction) in parallel with word lines 134 and disposed between vertical gates 134 of two adjacent rows of the vertical transistors 126. In some implementations, the rows of vertical transistors 126 separated by the trench isolation 160 are mirror-symmetric to one another with respect to the trench isolation 160. The trench isolation 160 can be formed with dielectric materials including, but not limited to, silicon oxide, silicon nitride, silicon oxynitride, low-k dielectrics, or any combination thereof. It is understood that the trench isolation 160 may include an air gap each disposed laterally between adjacent vertical gates 134. Air gaps may be formed due to the relatively small pitches of vertical transistors 126 in the bit line direction (e.g., the Y direction). On the other hand, the relatively large dielectric constant of air in air gaps (e.g., about 4 times of the dielectric constant of silicon oxide) can improve the insulation effect between vertical transistors 126 (and rows of DRAM cells 124) compared with some dielectrics (e.g., silicon oxide). Similarly, in some implementations, air gaps are formed laterally between word lines/gate electrodes 134 in the bit line direction as well, depending on the pitches of word lines/gate electrodes 134 in the bit line direction.

In some implementations, instead of the trench isolation 160 having the air gap being disposed between adjacent vertical gates 134 of two adjacent rows of the vertical transistors 126, a conductive structure 170 (e.g., including metal such as W) is disposed between adjacent semiconductor bodies 130 of two adjacent rows of vertical transistors 126. As described with further details below (e.g., FIGS. 2A-2H or FIGS. 3A-3E), the conductive structure 170 can be in contact with at least one of the adjacent semiconductor bodies 130 and can be coupled to a low voltage (e.g., a fixed negative voltage), which can reduce charge build-up in the memory cells 124, thereby mitigating the floating body effect in the memory cells 124. Moreover, by applying a fixed low voltage on the conductive structure 170 between the memory cells 124, a threshold voltage of the memory cells 124 can be conveniently adjusted, which can reduce the overall manufacturing complexity and cost, and improve reliability of the memory cells 124. Further, as described with further details below (e.g., FIGS. 4A-4B), the connection structure 170 can be coupled out from a same side as e word lines or a different side from the word lines. For example, the conductive structure 170 can be coupled out from the back side of the second semiconductor structure 104.

As shown in FIG. 1, in some implementations, a capacitor 128 includes a first electrode 144 above and coupled to the source or drain 138 of vertical transistor 126, e.g., the upper end of the semiconductor body 130, via a capacitor contact 142. In some implementations, the capacitor contact 142 is an ohmic contact, such as a metal silicide contact, as opposed to a Schottky contact. For example, the capacitor contact 142 may include metal silicides, such as WSi, CoSi, CuSi, AlSi, or any other suitable metal silicides having higher conductivities than doped silicon. The capacitor 128 can also include a capacitor dielectric above and in contact with the first electrode 144, and a second electrode above and in contact with the capacitor dielectric. That is, the capacitor 128 can be a vertical capacitor in which the electrodes and capacitor dielectric are stacked vertically (in the z-direction), and the capacitor dielectric can be sandwiched between the electrodes. In some implementations, each first electrode is coupled to source or drain 138 of a respective vertical transistor 126 in the same DRAM cell, while all second electrodes are coupled to a common plate 146 coupled to the ground, e.g., a common ground. The capacitor 128 can have a first end in the negative z-direction and a second end opposite the first end in the positive z-direction, as shown in FIG. 1. In some implementations, the first end of the capacitor 128 is coupled to the first terminal of the vertical transistor 126 via an ohmic contact (e.g., the capacitor contact 142 made of a metal silicide material). As shown in FIG. 1, the second semiconductor structure 104 can further include a capacitor contact 147 (e.g., a conductor) in contact with a common plate 146 for coupling the capacitors 128 to the peripheral circuits 112 or to the ground directly. In some implementations, the capacitor contact 147 (e.g., a conductor) extends in the z-direction from the dielectric layer of the bonding layer 120 to couple to the second end of the capacitor 128 via the common plate 146, as shown in FIG. 1. In some implementation, the ILD layer in which the capacitors 128 are formed has the same dielectric material as the two ILD layers into which the semiconductor body 130 extends, such as silicon oxide.

It is understood that the structure and configuration of a capacitor 128 are not limited to the example in FIG. 1 and may include any suitable structure and configuration, such as a planar capacitor, a stack capacitor, a multi-fins capacitor, a cylinder capacitor, a trench capacitor, or a substrate-plate capacitor. In some implementations, the capacitor dielectric includes dielectric materials, such as silicon oxide, silicon nitride, or high-k dielectrics including, but not limited to, Al2O3, HfO2, Ta2O5, ZrO2, TiO2, or any combination thereof. It is understood that in some examples, a capacitor 128 may be a ferroelectric capacitor used in a FRAM cell, and the capacitor dielectric may be replaced by a ferroelectric layer having ferroelectric materials, such as PZT or SBT. In some implementations, the electrodes include conductive materials including, but not limited to W, Co, Cu, Al, TiN, TaN, polysilicon, silicides, or any combination thereof.

As shown in FIG. 1, vertical transistor 126 extends vertically through and contacts the word lines 134, source or drain 138 of vertical transistor 126 at the lower end thereof is in contact with the bit line 123, and source or drain 138 of vertical transistor 126 at the upper end thereof is coupled to the capacitor 128. That is, the bit line 123 and the capacitor 128 can be disposed in different planes in the vertical direction and coupled to opposite ends of vertical transistor 126 of DRAM cell 124 in the vertical direction due to the vertical arrangement of vertical transistor 126. In some implementations, the bit line 123 and the capacitor 128 are disposed on opposite sides of the vertical transistor 126 in the vertical direction, which simplifies the routing of the bit lines 123 and reduces the coupling capacitance between the bit lines 123 and the capacitors 128 compared with DRAM cells in which the bit lines and capacitors are disposed on the same side of the planar transistors.

As shown in FIG. 1, in some implementations, the vertical transistors 126 are disposed vertically between the capacitors 128 and the bonding interface 106. That is, the vertical transistors 126 can be arranged closer to the peripheral circuits 112 of the first semiconductor structure 102 and the bonding interface 106 than the capacitors 128. Since the bit lines 123 and the capacitors 128 are coupled to opposite ends of the vertical transistors 126, the bit lines 123 (as part of the interconnect layer 122) are disposed vertically between the vertical transistors 126 and the bonding interface 106 As a result, the interconnect layer 122 including bit lines 123 can be arranged close to the bonding interface 106 to reduce the interconnect routing distance and complexity.

In some implementations, the second semiconductor structure 104 further includes a substrate 148 disposed above the DRAM cells 124. The substrate 148 can be part of a carrier wafer. It is understood that in some examples, the substrate 148 may not be included in the second semiconductor structure 104.

As shown in FIG. 1, the second semiconductor structure 104 can further include a pad-out interconnect layer 150 above the substrate 148 and the DRAM cells 124. The pad-out interconnect layer 150 can include interconnects, e.g., contact pads 154, in one or more ILD layers. The pad-out interconnect layer 150 and the interconnect layer 122 can be formed on opposite sides of the DRAM cells 124. The capacitors 128 can be disposed vertically between the vertical transistors 126 and the pad-out interconnect layer 150. In some implementations, the interconnects in pad-out interconnect layer 150 can transfer electrical signals between the 3D semiconductor device 100 and outside circuits, e.g., for pad-out purposes.

In some implementations, the second semiconductor structure 104 further includes one or more contacts 152 extending through the substrate 148 and part of the pad-out interconnect layer 150 to couple the pad-out interconnect layer 150 to the DRAM cells 124 and the interconnect layer 122. As a result, the peripheral circuits 112 can be coupled to the DRAM cells 124 through the interconnect layers 116 and 122 as well as the bonding layers 120 and 118, and the peripheral circuits 112 and the DRAM cells 124 can be coupled to outside circuits through contacts 152 and pad-out interconnect layer 150. Contact pads 154 and contacts 152 can include conductive materials including, but not limited to, W, Co, Cu, Al, silicides, or any combination thereof. In one example, the contact pad 154 may include Al, and the contact 152 may include W. In some implementations, the contact 152 includes a via surrounded by a dielectric spacer (e.g., having silicon oxide) to electrically separate the via from substrate 148. Depending on the thickness of substrate 148, contact 152 can be an ILV having a depth in the submicron level (e.g., between 10 nm and 1 μm), or a TSV having a depth in the micron- or tens micron-level (e.g., between 1 μm and 100 μm).

Although not shown, it is understood that the pad-out of 3D memory devices is not limited to from the second semiconductor structure 104 having DRAM cells 124 as shown in FIG. 1 and may be from the first semiconductor structure 102 having peripheral circuit 112. Although not shown, it is also understood that the air gaps between word lines 134 and/or between semiconductor bodies 130 may be partially or fully filled with dielectrics. Although not shown, it is further understood that more than one array of DRAM cells 124 may be stacked over one another to vertically scale up the number of DRAM cells 124.

In some implementations, instead of having the substrate 148 above the DRAM cells 124 as shown in FIG. 1, the second semiconductor structure 104 includes a substrate disposed below the DRAM cells 124. The substrate can be part of a carrier wafer. The DRAM cells 124 can be formed in a front side of the substrate, and the bit lines 123 can be formed in a back side of the substrate. The bit lines 123 can be conductively coupled to the DRAM cells 124 (e.g., the terminals 138 of the vertical transistors 126) through the substrate.

FIGS. 2A-2H illustrate cross-sectional views (e.g., in the XZ plane) of example 3D semiconductor structures 200*a-h*, in accordance with some implementations of the present disclosure. One or more of 3D semiconductor structures 200*a-h* can be similar to, or same as, 3D semiconductor device 100 of FIG. 1, or a part of the 3D semiconductor device 100 of FIG. 1 (e.g., the second semiconductor structure 104 of FIG. 1), or a structure at an intermediate fabrication process of the 3D semiconductor device 100 of FIG. 1.

Figure 2A:
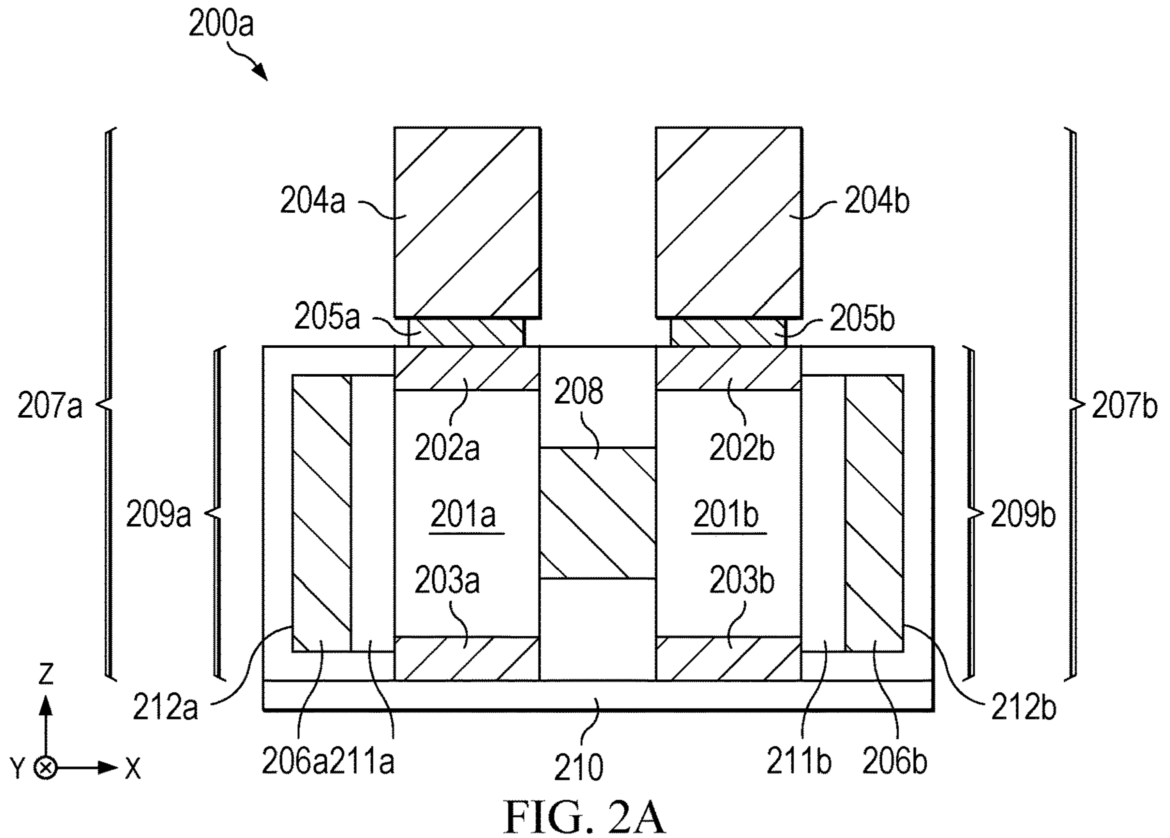
FIGS. 2A-2H illustrate cross-sectional views of example 3D semiconductor structures.

As shown in FIG. 2A, semiconductor structure 200*a* includes two adjacent memory cells 207*a* and 207*b* coupled to bit line 210. Note that semiconductor structure 200*a* is shown to include two memory cells for illustrative purpose only. In some implementations, semiconductor structure 200*a* includes any suitable number of memory cells.

In some implementations, each one of memory cells 207*a* and 207*b* includes a vertical transistor and a capacitor coupled to the vertical transistor. In the shown example, memory cell 207*a* includes vertical transistor 209*a* and capacitor 204*a* coupled to vertical transistor 209*a* via contact 205*a*. Memory cell 207*b* includes vertical transistor 209*b* and capacitor 204*b* coupled to vertical transistor 209*b* via contact 205*b*.

In some implementations, each one of vertical transistors 209*a* and 209*b* includes a semiconductor body, a first terminal, a second terminal, and a gate terminal. One of the first terminal and the second terminal can be a source terminal, and the other one of the first terminal and the second terminal can be a drain terminal. In the shown example, vertical transistor 209*a* includes semiconductor body 201*a*, first terminal 202*a*, second terminal 203*a*, and gate terminal 212*a*. Vertical transistor 209*b* includes semiconductor body 201*b*, first terminal 202*b*, second terminal 203*b*, and gate terminal 212*b*.

In some implementations, each gate terminal of a vertical transistor includes a gate electrode and a gate dielectric. In the shown example, gate terminal 212*a* includes gate electrode 206*a* and gate dielectric 211*a*. Gate terminal 212*b* includes gate electrode 206*b* and gate dielectric 211*b*.

In some implementations, semiconductor structure 200*a* include a conductive structure between vertical transistors 209*a* and 209*b*. In some examples, the conductive structure can be in contact with at least one of semiconductor bodies (e.g., semiconductor bodies 201*a* and 201*b*) of vertical transistors 209*a* and 209*b*. In the shown example, conductive structure 208 is in contact with both semiconductor bodies 201*a* and 201*b*.

In some implementations, conductive structure 208 includes one or more conductive layers that include at least one of a metallic layer, a polysilicon layer, a germanium-silicon (GeSi) layer, or a barrier layer such as titanium nitride (TiN).

In some implementations, each one of semiconductor bodies 201*a* and 201*b* includes opposite ends along a first direction (e.g., Z direction) and opposite sides along a second direction (e.g., X direction) perpendicular to the first direction. In such implementations, first terminals 202*a* and 202*b*, and second terminals 203*a* and 203*b* are located at the opposite ends of semiconductor bodies 201*a* and 201*b*, respectively. In the shown example, first terminal 202*a* and second terminal 203*a* are located at opposite ends of semiconductor bodies 201*a*, and first terminal 202*b* and second terminal 203*b* are located at opposite ends of semiconductor bodies 201*b*.

In some implementations, gate terminal 206*a*, 206*b* and conductive structure 208 are located at two opposite sides of semiconductor bodies 201*a* and 201*b*, respectively. In the shown example, gate terminal 212*a* and conductive structure 208 are located at opposite sides of semiconductor body

201*a*, and gate terminal 212*b* and conductive structure 208 are located at opposite sides of semiconductor body 201*b*.

In some implementations, a working function of conductive structure 208 is higher than a working function of a semiconductor body (e.g., semiconductor body 201*a*, 201*b*) in contact with conductive structure. In some implementations, a working function is defined as the minimum amount of energy (e.g., measured in electron volts, eV) required to remove an electron from a solid to a point immediately outside the solid surface (or energy needed to move an electron from the Fermi level into vacuum). In some examples, the working function of a material can be dependent on the material's electronic structure and its surface state. Different materials, therefore, can have different working functions. In some examples, it can be more difficult to remove an electron from a material with a high working function than from a material with a low working function.

In some examples, when two materials with different working functions are in contact, electrons can move from the material with the lower working function (easier to remove electrons) to the one with the higher working function (harder to remove electrons). This can happen until their Fermi levels (energy level where finding an electron is 50% probable) equalize. This electron movement creates an electric field and a barrier called the "Schottky Barrier," which stops further electron flow. However, if an external energy source like a voltage is applied, it can overcome this barrier, causing a current to flow, mainly from the lower working function material to the higher one.

In some implementations, conductive structure 208 is configured such that a Schottky Barrier is formed at an interface between conductive structure 208 and a semiconductor body (e.g., semiconductor body 201*a*, 201*b*) in contact with conductive structure 208.

In some implementations, conductive structure 208 is coupled to a fixed voltage. In such implementations, conductive structure 208 is coupled to the fixed voltage, such that, in operation, a current path is formed from the semiconductor body in contact with conductive structure 208 to conductive structure 208. In some examples, the fixed voltage is a negative voltage. In some examples, the fixed voltage is associated with a threshold voltage of at least one of the adjacent memory cells (e.g., memory cell 207*a* or 207*b*).

By using a conductive structure (e.g., conductive structure 208) between two adjacent memory cells, a floating body effect can be mitigated. In some examples, the floating body effect can be a phenomenon observed in Silicon-on-Insulator (SOI) technologies where a transistor's body is not connected to a reference voltage and is instead electrically isolated, or "floating." The effect refers to the accumulation of charge in this floating body region, which can shift the device's threshold voltage and alter its characteristics. This can sometimes lead to issues like increased leakage currents and device instability, particularly as devices are miniaturized. By coupling the conductive structure to a fixed voltage, charges build-up in the floating body region of the transistors can be reduced, thereby mitigating the floating body effect in the memory cells.

In some examples, a threshold voltage of a memory cell (e.g., memory cell 207*a* or 207*b*) can be adjusted by changing a working function of a gate structure (e.g., gate electrode 206*a* or 206*b*) coupled to the memory cell. However, changing the working function of the gate structure can impact other device characteristics such as leakage current and the subthreshold slope. Moreover, changing the working function of the gate structure can require different fabrication processes or condition, which could affect the overall manufacturing complexity or cost as well as long-term reliability.

In some examples, a threshold voltage of a memory cell (e.g., memory cell 207*a* or 207*b*) can be adjusted by applying a fixed negative voltage on a conductive structure (e.g., conductive structure 208) that is in contact with a semiconductor body (e.g., semiconductor body 201*a* or 201*b*) of the memory cell. By applying a fixed negative voltage on the conductive structure between the memory cells, a threshold voltage of the memory cells can be conveniently adjusted, reducing the overall manufacturing complexity and cost, and improving reliability of the memory cells.

In some implementations, conductive structure 208 can have different configurations (e.g., shapes, parts, sizes, locations, etc.). In the example shown in FIG. 2A, conductive structure 208 is in contact with a middle part of semiconductor bodies 201*a* and 201*b*.

FIGS. 2B-2H illustrate other various configurations of the conductive structure between adjacent memory cells. Reference numerals and description of elements in FIGS. 2B-2H that are similar to those as described with reference to FIG. 2A may be omitted below for brevity.

Figure 2B:
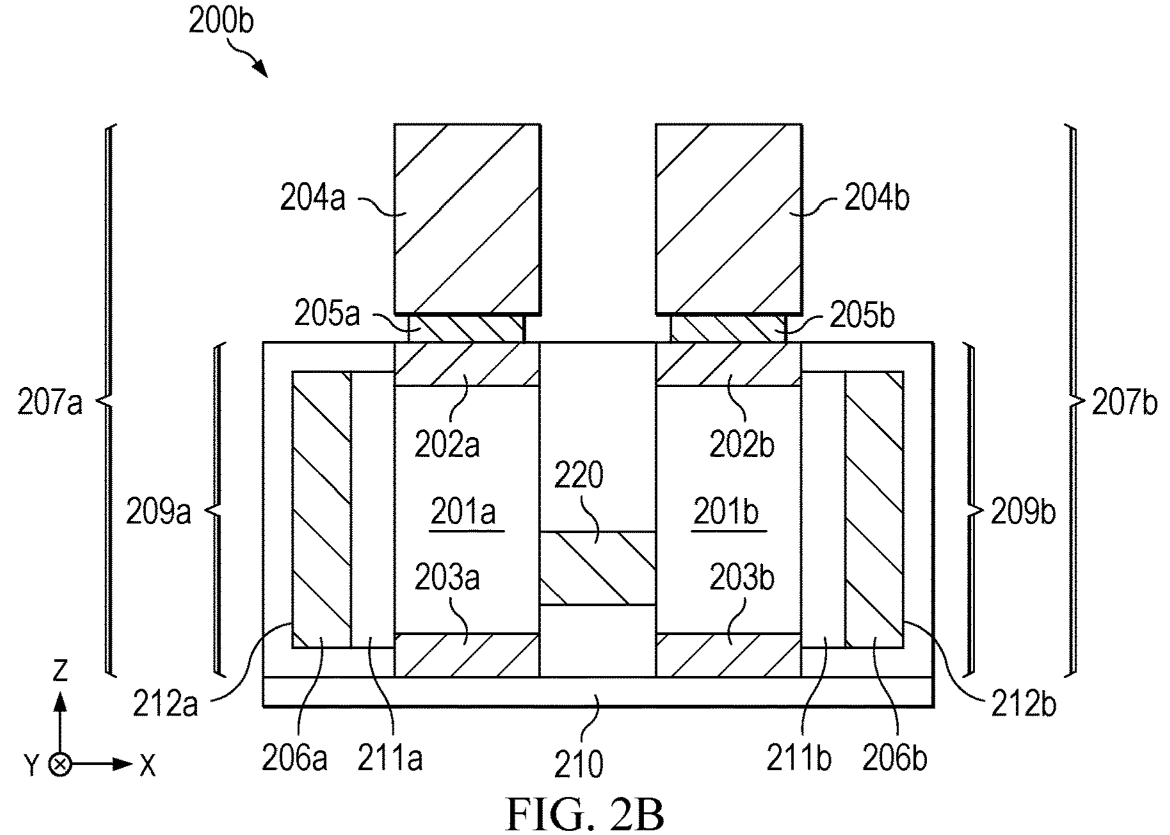

Referring to FIG. 2B, conductive structure 220 is in contact with a part of an adjacent semiconductor body that is closer to a second terminal than a first terminal of an adjacent vertical transistor, where the first terminal is located closer to a capacitor coupled to the adjacent vertical transistor than the second terminal.

Figure 2C:
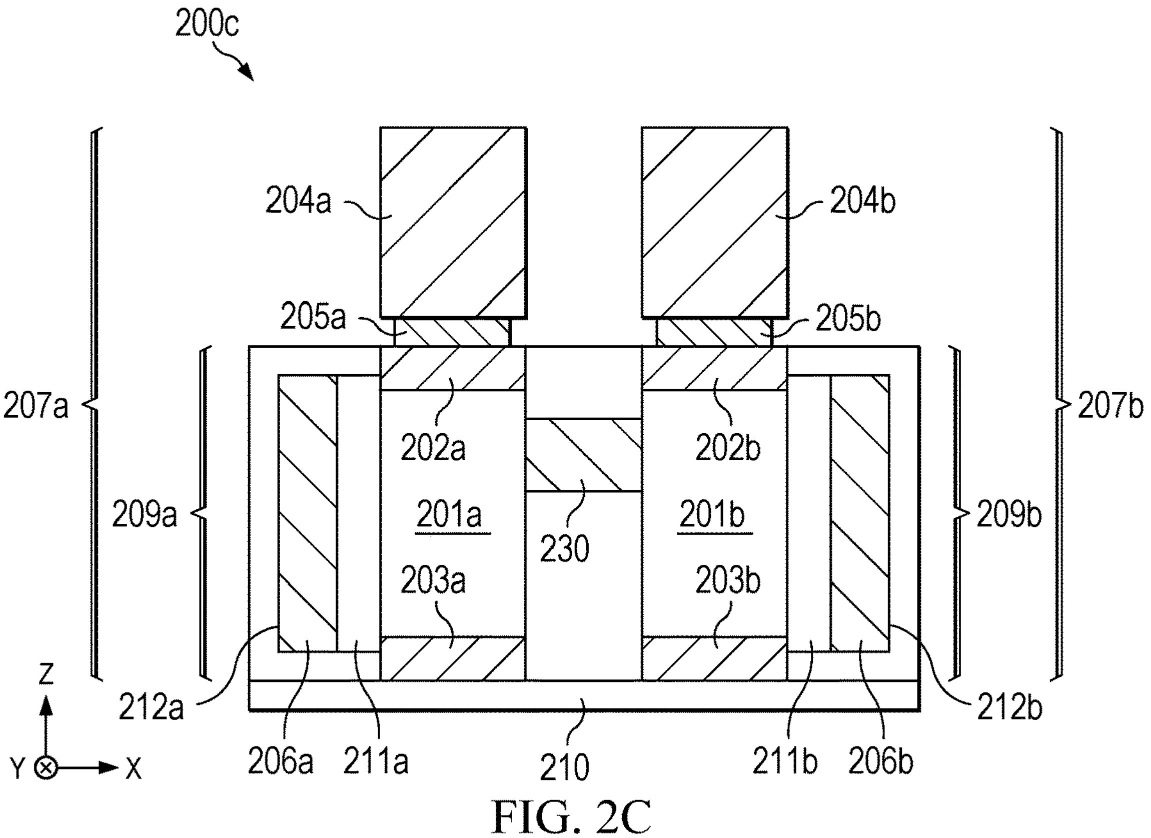

Referring to FIG. 2C, conductive structure 230 is in contact with a part of an adjacent semiconductor body that is closer to a first terminal than a second terminal of an adjacent vertical transistor, where the first terminal is located closer to a capacitor coupled to the adjacent vertical transistor than the second terminal.

Figure 2D:
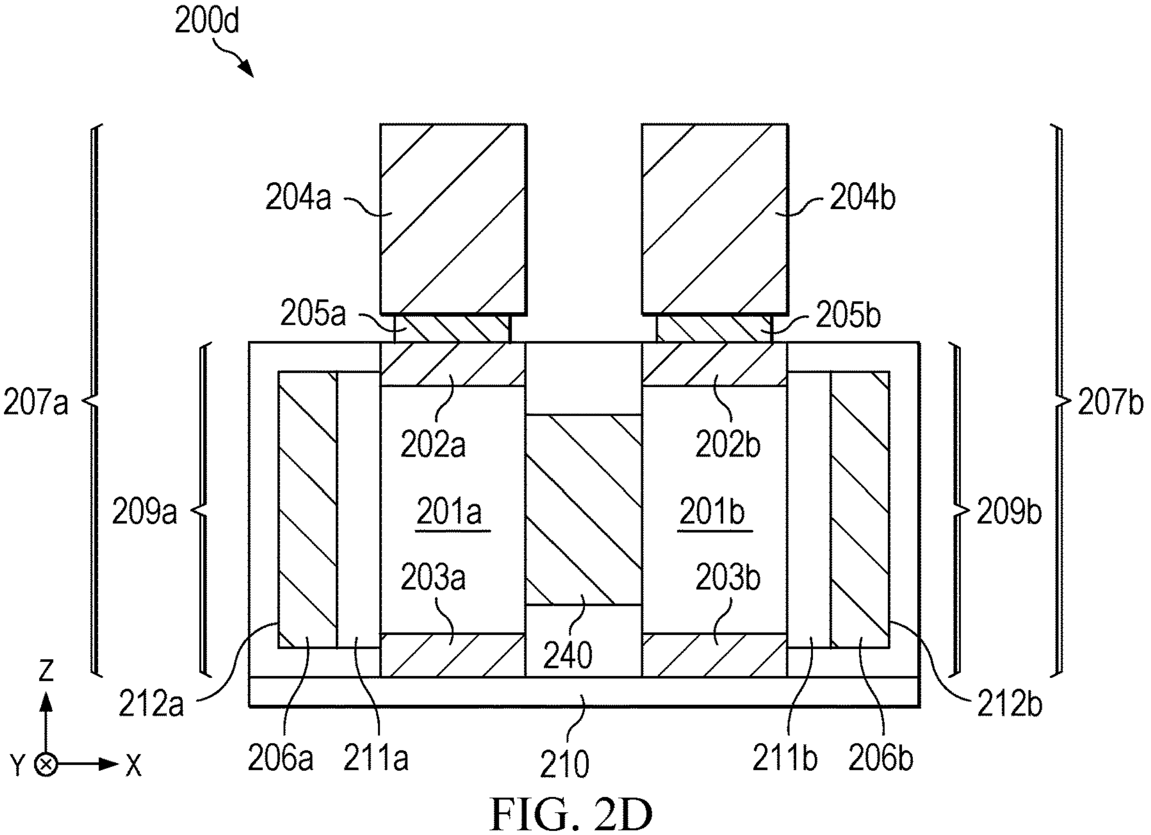

Referring to FIG. 2D, conductive structure 240 is in contact with a substantial part of an adjacent semiconductor body that includes, e.g., a first part that is closer to a first terminal of an adjacent vertical transistor, a second part that is closer to a second terminal of the adjacent vertical transistor, and a middle part between the first and second parts. The conductive structure 240 is spaced away from the first terminal and the second terminal of the adjacent vertical transistor.

Figure 2E:
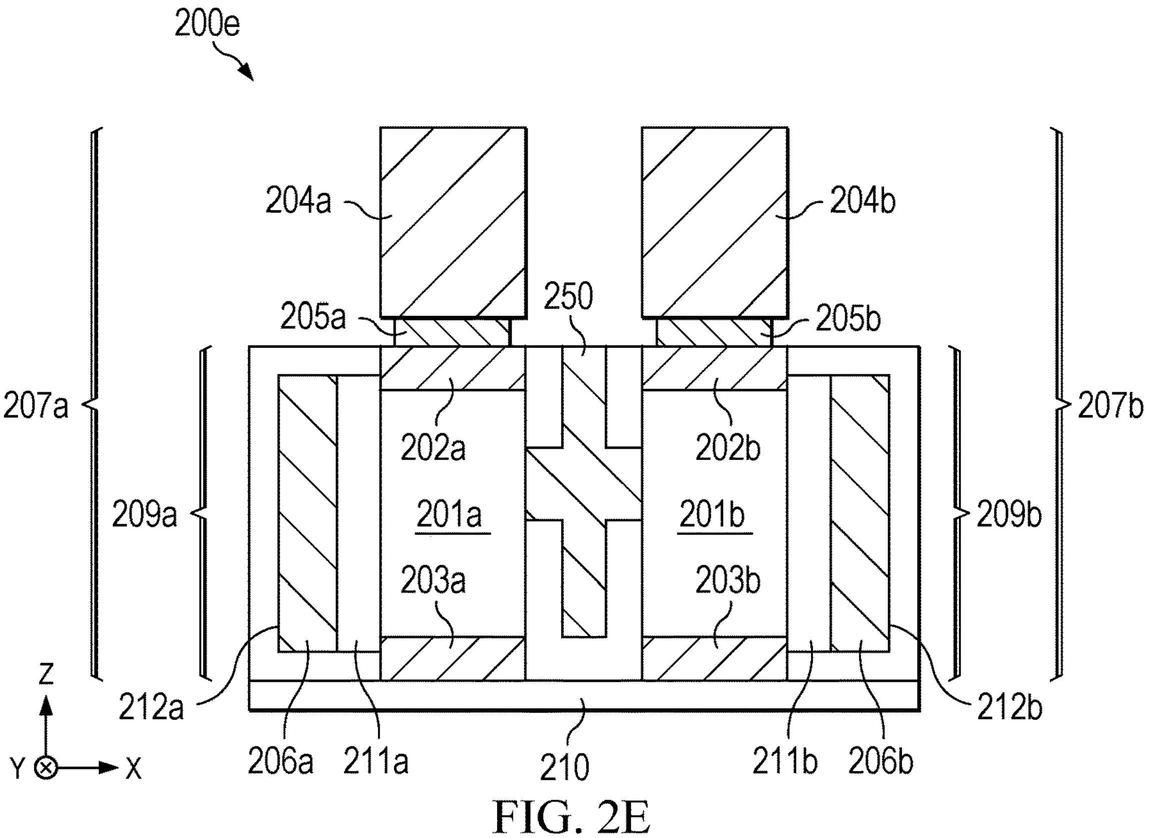

Referring to FIG. 2E, conductive structure 250 includes two parts-a first part along the Z direction, and a second part crossing the first part along the X direction. In the shown example, the first part of conductive structure 250 extends along the Z direction and spaced from the two terminals of each of the two adjacent transistors. The second part of conductive structure 250 is in contact with each of the semiconductor bodies of adjacent memory cells. Note that conductive structure 250 in semiconductor structure 200*e* is shown to include two parts for illustratively purpose only. Conductive structure 250 can have any suitable number of parts. In some examples, conductive structure 250 can have two first parts and one second part, each first part extending along the Z direction and the second part crossing the two first parts along the X direction. In some examples, conductive structure 250 can have one first part and two second parts, the first part extending along the Z direction and the two second parts crossing the first part along the X direction.

Figure 2F:
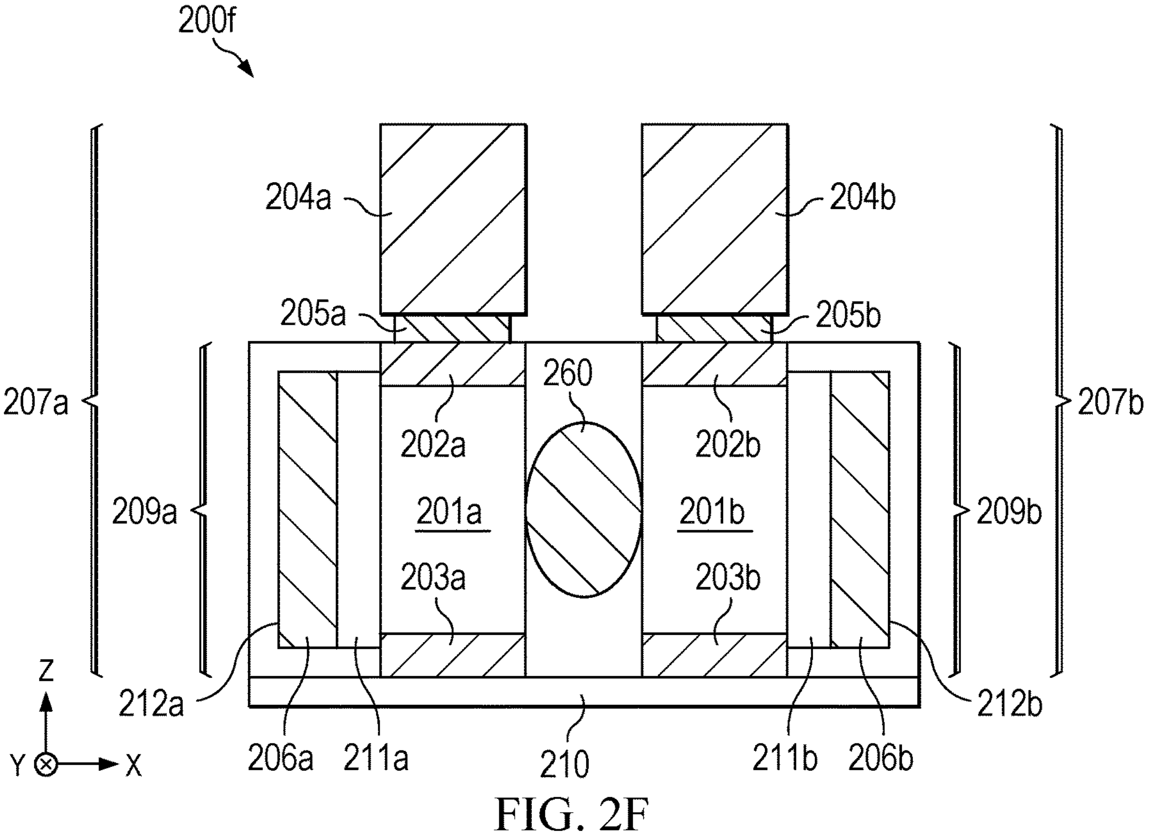

Referring to FIG. 2F, conductive structure 260 includes an oval shape having edges in contact with the semiconductor bodies of the adjacent transistors. In some implementations, conductive structure 260 has any suitable variation of the oval shape, such as circle, ellipse, oblong, stadium, Lamé curve, Cassini oval, or Cartesian oval, etc.

Figure 2G:
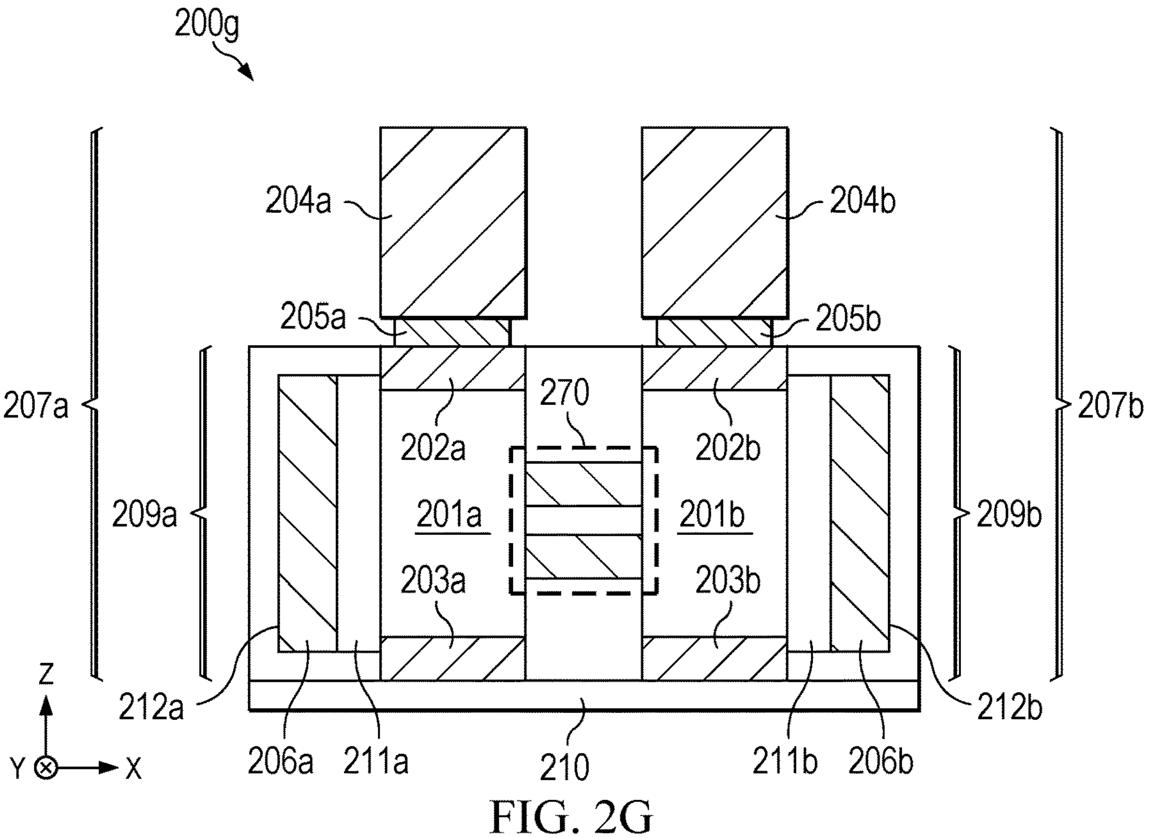

Referring to FIG. 2G, conductive structure 270 includes two conductive bars spaced along the Z direction. Each of the two conductive bars is in contact with the semiconductor bodies of the adjacent transistors. Note that conductive structure 270 is shown to include two conductive bars for illustratively purpose only. In some implementations, conductive structure 270 can have any suitable number of conductive bars. The conductive bars in the conductive structure 270 can be coupled to a same voltage source providing a fixed voltage.

Figure 2H:
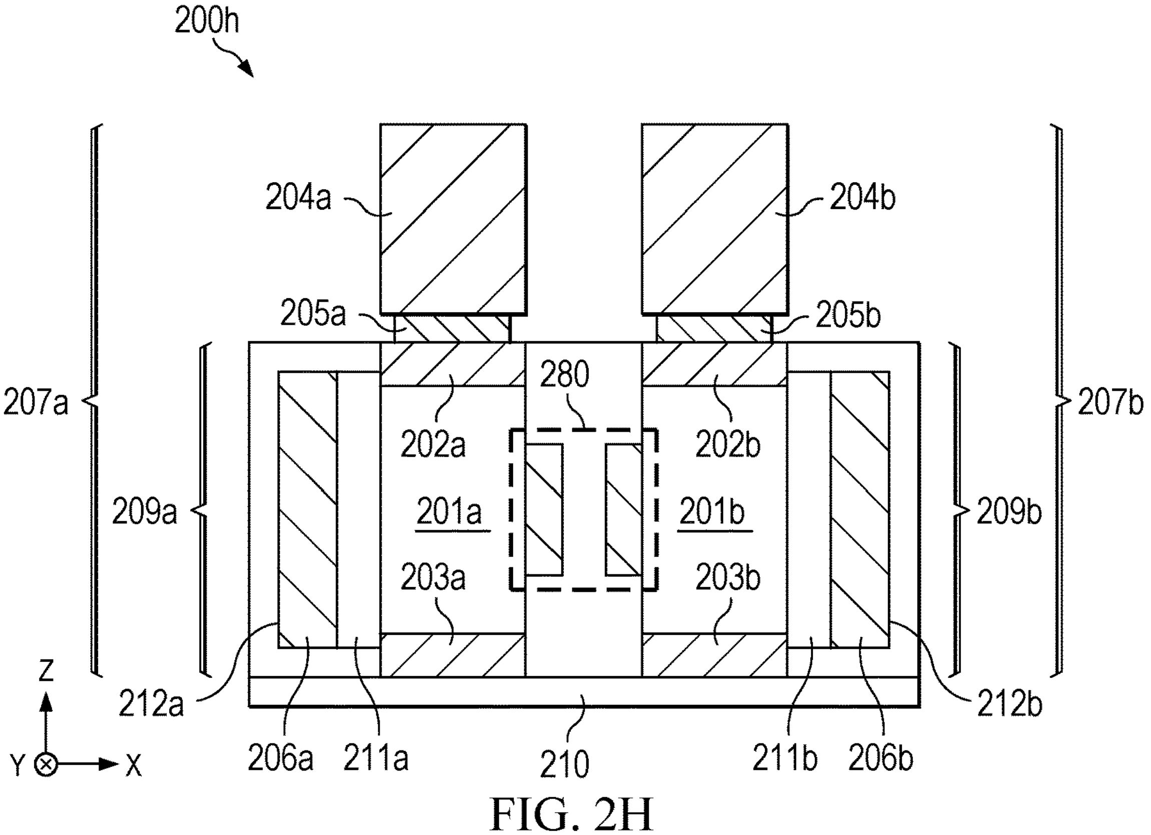

Referring to FIG. 2H, conductive structure 280 includes two conductors that are spaced from each other along the X direction. Each of the two conductors is in contact with a respective one of the semiconductor bodies of the adjacent transistors. Note that conductive structure 280 is shown to include two conductors for illustratively purpose only. In some implementations, conductive structure 280 can have any suitable number of conductors. In some examples, conductive structure 280 can include three conductors-two conductors in contact with a semiconductor body of a first adjacent transistor, and one conductor in contact with a semiconductor body of a second adjacent transistor. In some examples, conductive structure 280 can include four conductors-two conductors in contact with a semiconductor body of a first adjacent transistor, and two conductors in contact with a semiconductor body of a second adjacent transistor. The conductors in the conductive structure 280 can be coupled to a same voltage source providing a fixed voltage.

In some implementations, a conductive structure between two adjacent memory cells can have any suitable combination of the conductive structures as described with reference to FIGS. 2A-2H. For example, a conductive structure as described herein can include an oval part and one conductive bar. As another example, a conductive structure as described herein can include a conductive bar and a conductor, where the conductive bar is in contact with the semiconductor bodies of two adjacent transistors, and the conductor is in contact with a semiconductor body of one of the two adjacent transistors.

FIGS. 3A-3E illustrate top views (e.g., in the XY plane) of example 3D semiconductor structures 300*a-e*, in accordance with some implementations of the present disclosure. One or more of 3D semiconductor structures 300*a-e* can be similar to, or same as, 3D semiconductor device 100 of FIG. 1, or a part of the 3D semiconductor device 100 of FIG. 1 (e.g., the second semiconductor structure 104 of FIG. 1), or a structure at an intermediate fabrication process of the 3D semiconductor device 100 of FIG. 1.

Figure 3B:
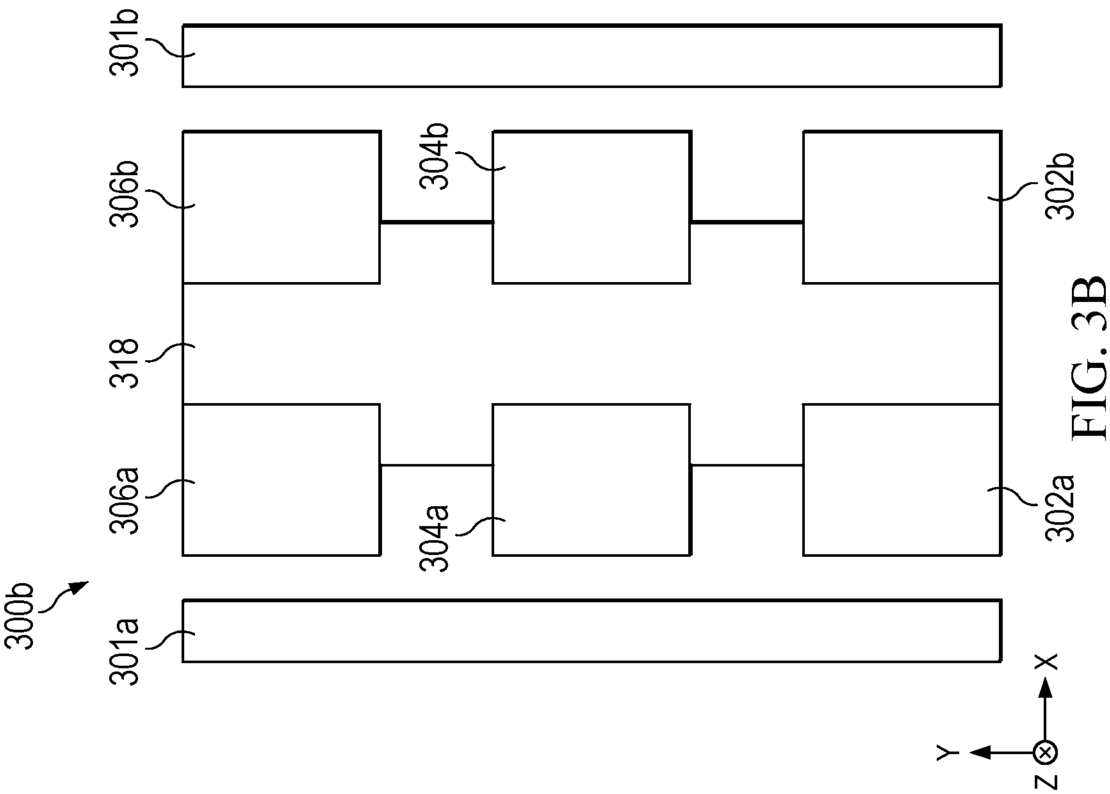
FIGS. 3A-3E illustrates top views of example 3D semiconductor structures.
Figure 3A:
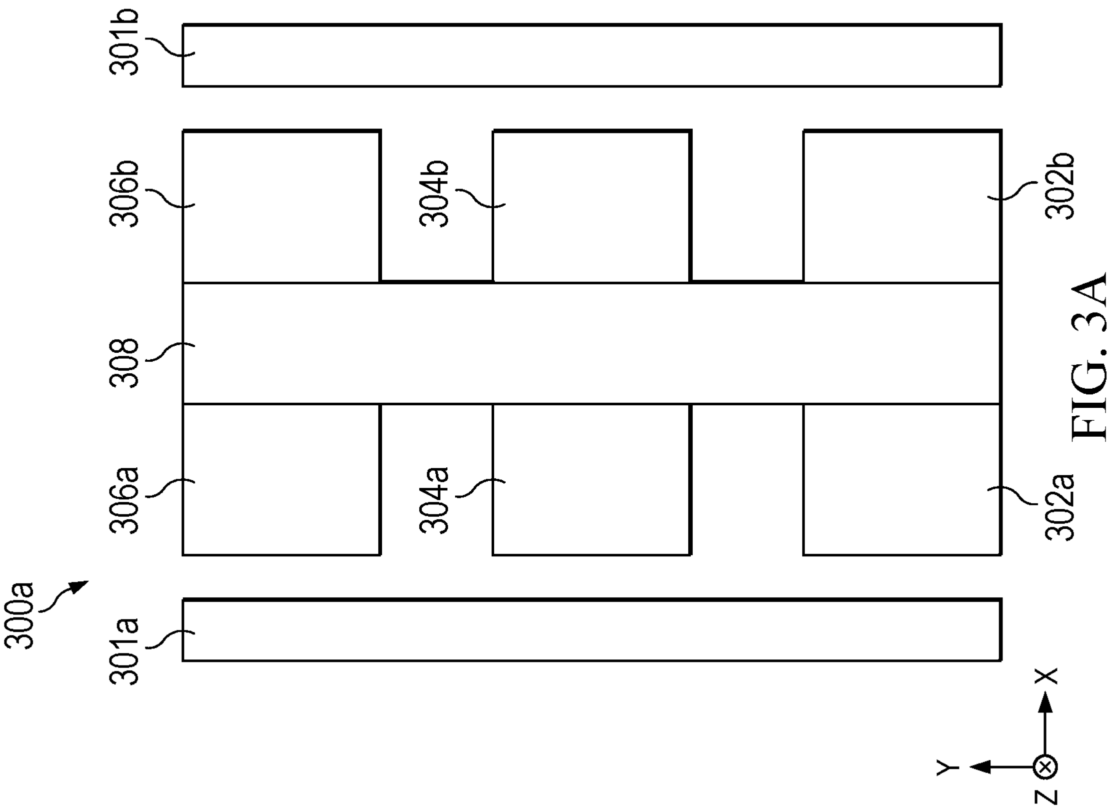

As shown in FIG. 3A, semiconductor structure 300*a* includes two rows of memory cells, where each row of the memory cells extends along the Y direction. In some implementations, each memory cell of the two rows of memory cells includes a semiconductor body. In the shown example, a first row of memory cells include semiconductor bodies 302*a*, 304*a*, and 306*a*. A second row of memory cells include semiconductor bodies 302*b*, 304*b*, and 306*b*. Note that semiconductor structure 300*a* is shown to include three memory cells in each row for illustrative purpose only. In some implementations, semiconductor structure 300*a* includes any suitable number of memory cells in each row of memory cells.

Semiconductor structure 300*a* further includes two word lines 301*a* and 301*b*. Word lines 301*a* and 301*b* are spaced along the X direction, and each one of word lines 301*a* and 301*b* extends along the Y direction. Each one of word lines 301*a* and 301*b* is coupled to the memory cells of an adjacent row of memory cells. In some implementations, gate terminals of the adjacent row of memory cells are connected together to form a corresponding word line (e.g., word line 301*a* or 301*b*).

Semiconductor structure 300*a* further includes conductive structure 308. As shown, conductive structure 308 extends along the Y direction and has opposite sides along the X direction. Semiconductor bodies of the two rows of memory cells are coupled to the opposite sides of conductive structure 308. In the shown example, semiconductor bodies 302*a*, 304*a*, and 306*a* are coupled to a first side of conductive structure 308, and semiconductor bodies 302*b*, 304*b*, and 306*b* are coupled to a second side of conductive structure 308.

FIGS. 3B-3E illustrate other various configurations of the conductive structures between two adjacent rows of memory cells. Reference numerals and description of elements in FIGS. 3B-3E that are similar to those as described with reference to FIG. 3A may be omitted below for brevity.

Referring to FIG. 3B, conductive structure 318 includes a first part and two second parts. The first part of conductive structure 318 extends along the Y direction and is coupled to semiconductor bodies of the two rows of memory cells along the X direction. Each one of the two second parts of conductive structure 318 extends along the X direction and is located between adjacent semiconductor bodies along the Y direction. Note that conductive structure 318 is shown to include two second parts for illustratively purpose only. In some implementations, conductive structure 318 includes any suitable number, e.g., 1, 3, or 10, of second parts, depending on the number of memory cells in each row of memory cells. The number of second parts in the conductive structure 318 is identical to the number of memory cells in each row of memory cells minus 1.

Figure 3D:
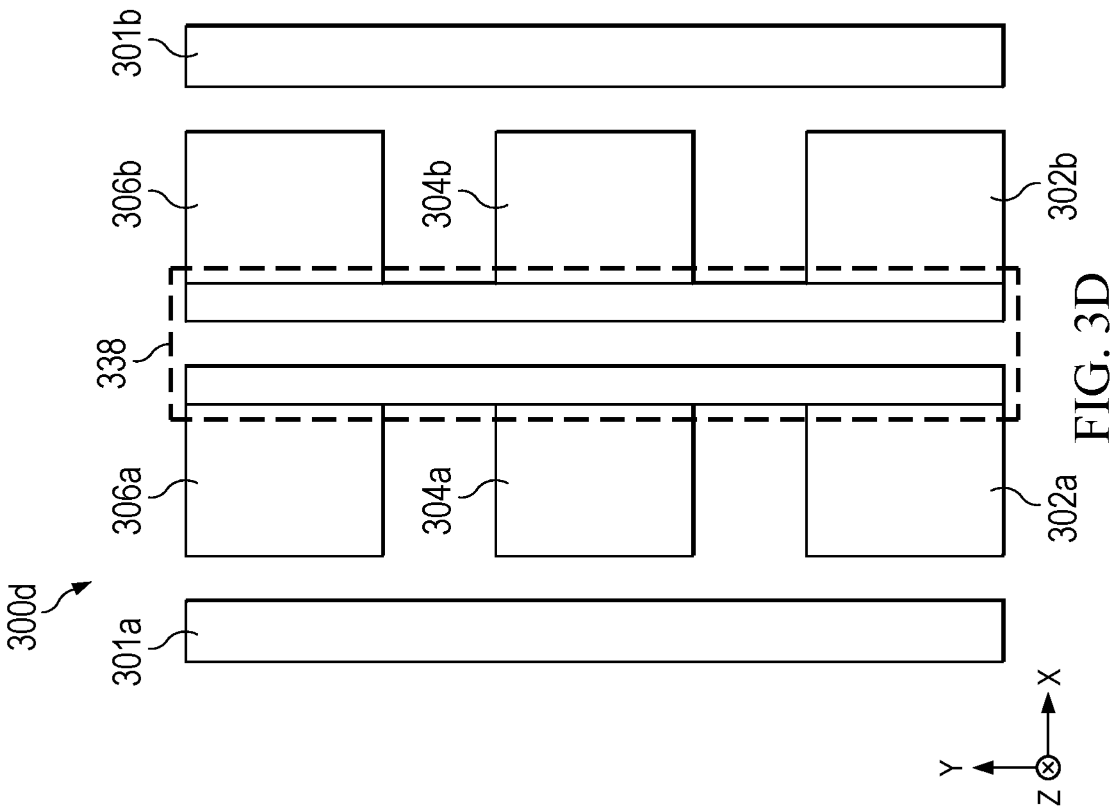
Figure 3C:
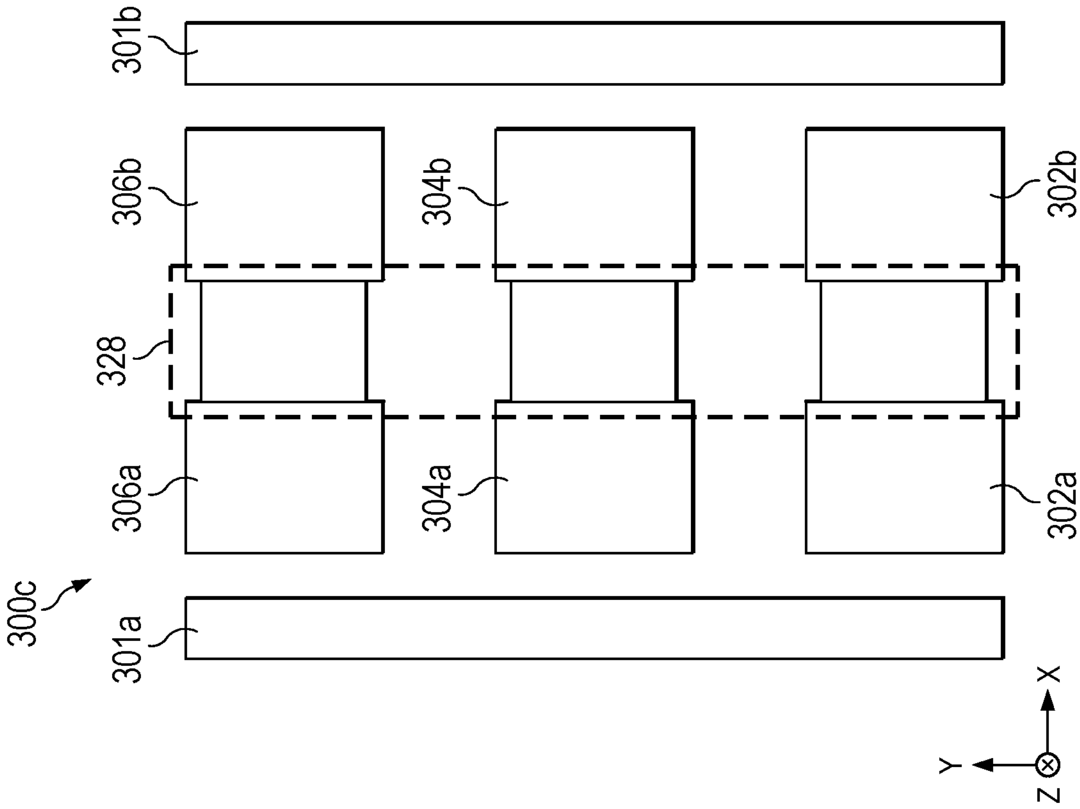

Referring to FIG. 3C, conductive structure 328 includes three conductors spaced from one another along the Y direction. In the shown example, each of the three conductors of conductive structure 328 is coupled to the semiconductor bodies of two adjacent memory cells. Note that conductive structure 328 is shown to include three conductors for illustratively purpose only. In some implementations, conductive structure 328 includes any suitable number of conductors, depending on the number of memory cells in each row of memory cells. The conductors of the conductive structure 328 can be coupled to a same voltage source for providing a same fixed voltage.

Referring to FIG. 3D, conductive structure 338 includes two conductors spaced from each other along the X direction. In the shown example, each one of the two conductors of conductive structure 338 extends along the Y direction. A first conductor of conductive structure 338 is coupled to the semiconductor bodies of a first row of the two rows of memory cells, and a second conductor of conductive structure 338 is coupled to the semiconductor bodies of a second row of the two rows of memory cells. The two conductive structures 338 can be coupled to a same voltage source for providing a same fixed voltage.

Figure 3E:
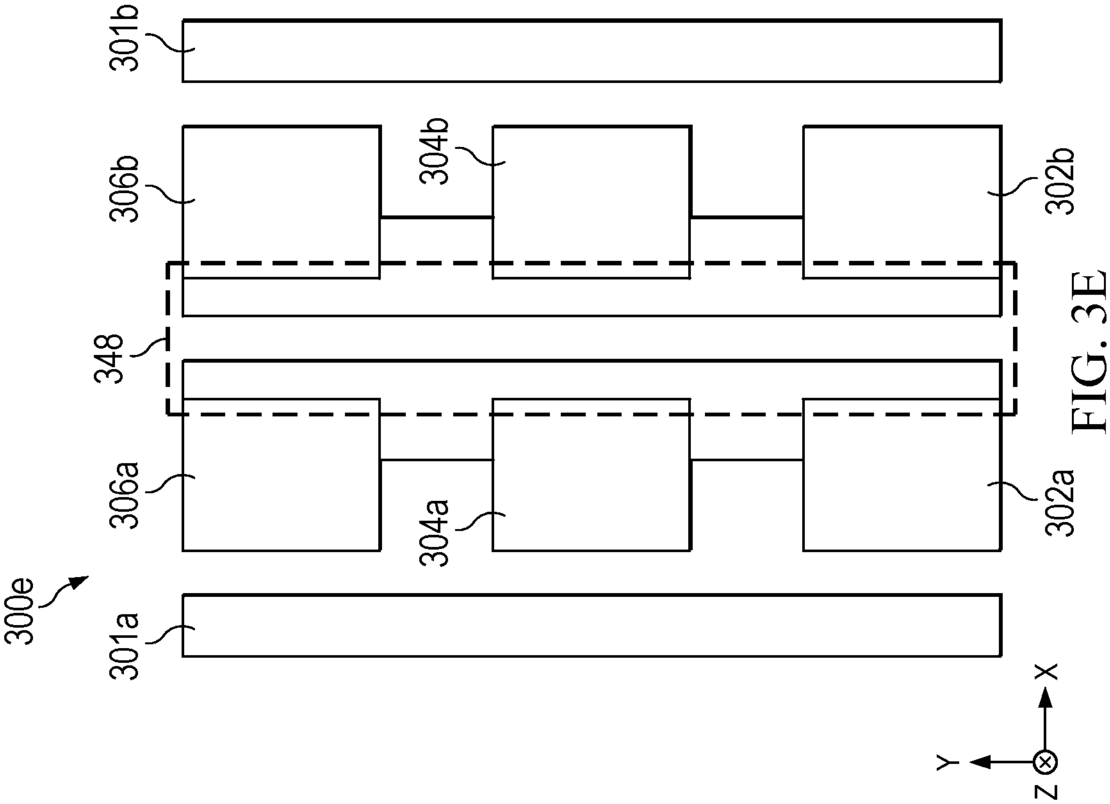

Referring to FIG. 3E, conductive structure 348 includes two conductors. As shown, a first conductor of conductive structure 348 includes a first part extending along the Y direction, and two second parts extending along the X direction. The first part of the first conductor is coupled to semiconductor bodies of a first row of the two rows of memory cells. Each one of the two second parts is located between adjacent semiconductor bodies along the Y direction.

A second conductor of conductive structure 348 is mirror-symmetrical to the first conductor of conductive structure. The second conductor includes a third part extending along the Y direction, and two fourth parts extending along the X direction. The third part of the second conductor is coupled to semiconductor bodies of a second row of the two rows of memory cells. Each one of the two fourth parts is located between adjacent semiconductor bodies along the Y direction. The conductors in the conductive structure 348 can be coupled to a same voltage source for providing a same fixed voltage.

In some implementations, a conductive structure between two adjacent rows of memory cells can have any suitable combination of the conductive structures as described with reference to FIGS. 3A-3E. For example, a conductive structure as described herein can include one conductor similar to the conductors as described with reference to FIG. 3C and coupled to upper two semiconductor bodies, and two conductors similar to the conductors as described with reference to FIG. 3D and coupled to lower four semiconductor bodies. As another example, a conductive structure as described herein can include one conductor similar to the conductors as described with reference to FIG. 3D and coupled to the semiconductor bodies of a first row of memory cells, and one conductor similar to the conductors as described with reference to FIG. 3E and coupled to the semiconductor bodies of a second row of the memory cells.

In some implementations, a conductive structure can have any suitable combination of the conductive structure as described with reference to any one of FIGS. 3A-3E and the conductive structure as described with reference to any one of FIGS. 2A-2H. For example, the conductive structure shown in FIG. 3A or FIG. 3B can be combined with the conductive structure shown in FIG. 2A, FIG. 2B, FIG. 2C, FIG. 2D, FIG. 2E, FIG. 2F, or FIG. 2G.

Figure 4A:
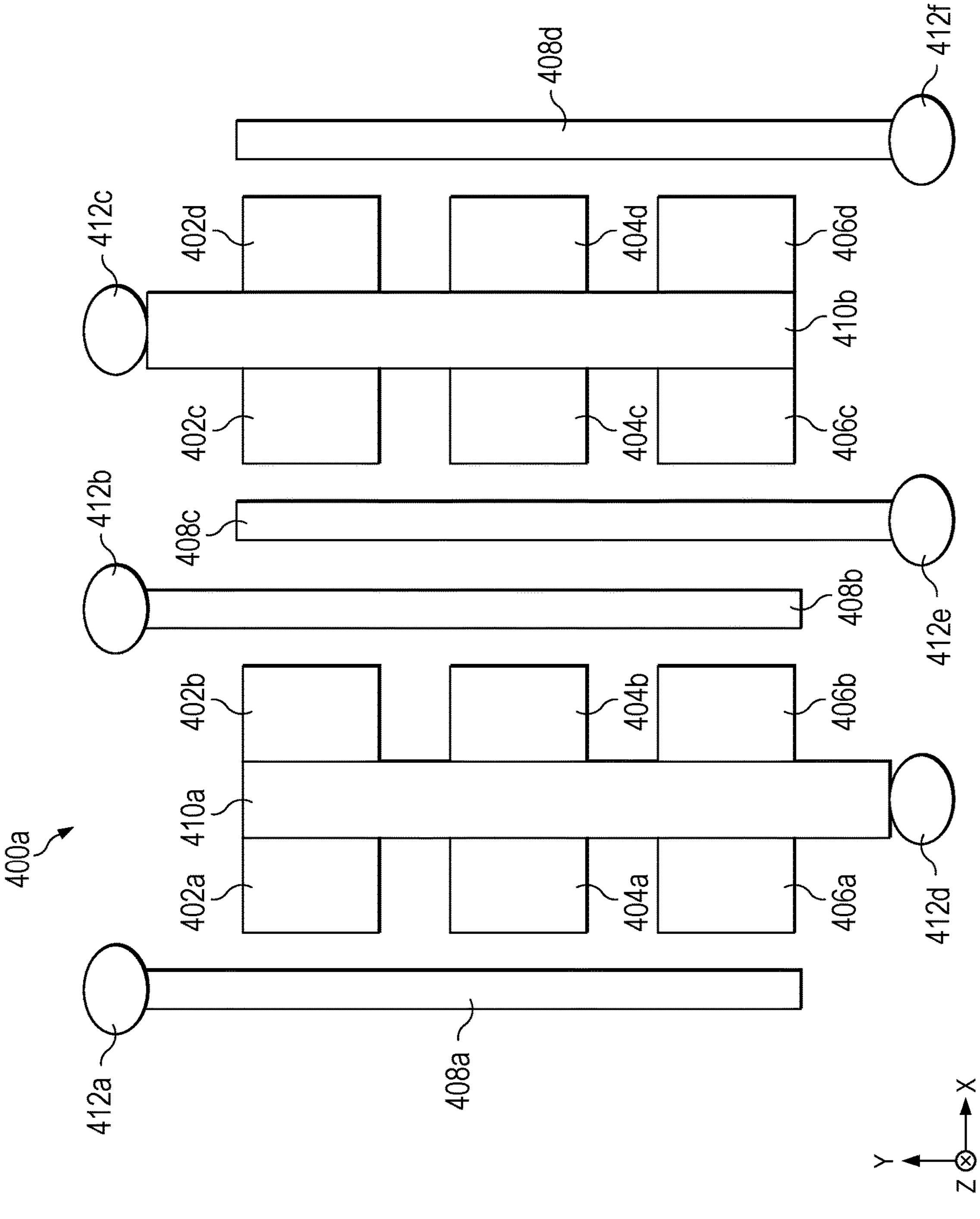
FIGS. 4A-4B illustrate top views of example 3D semiconductor structures.
Figure 4B:
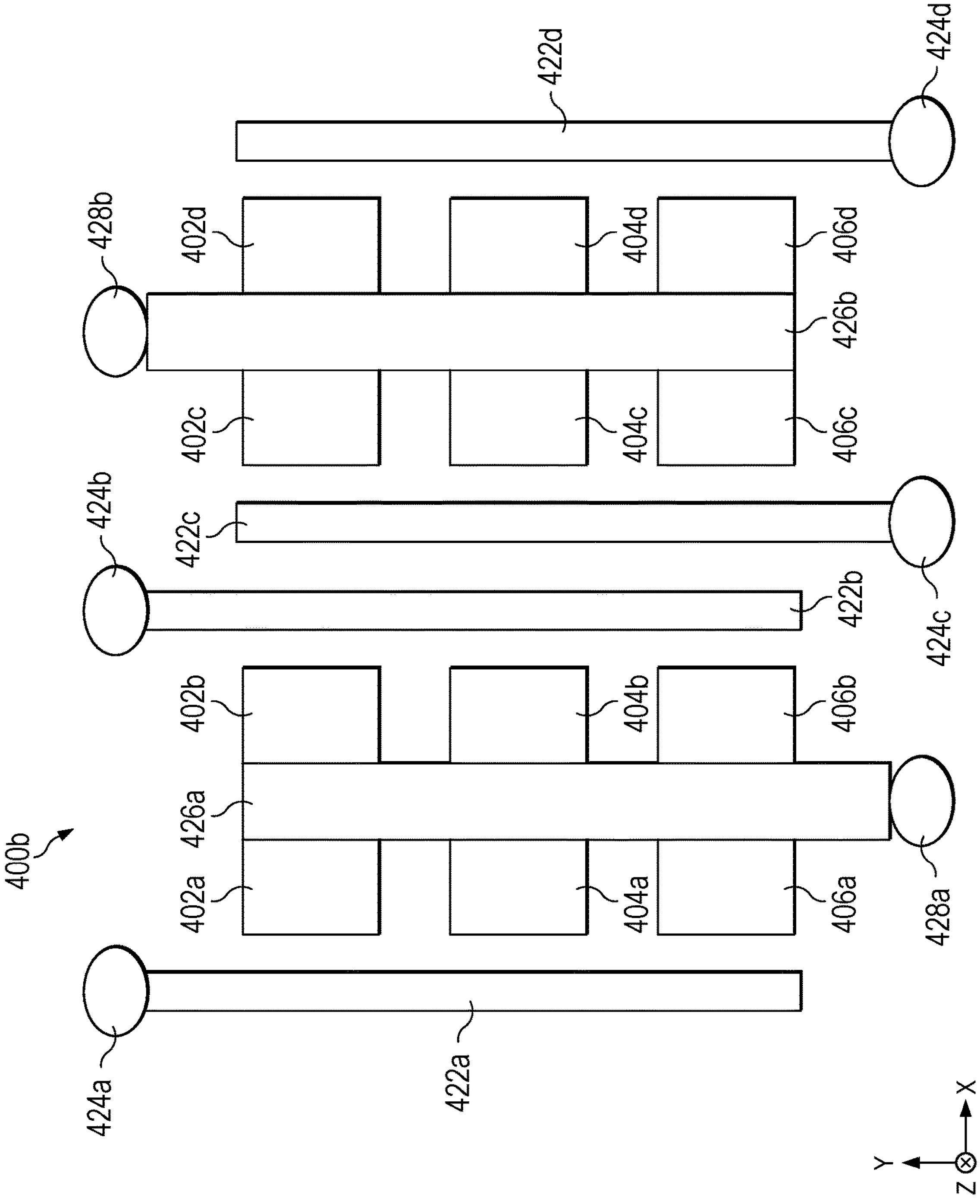

FIGS. 4A-4B illustrate top views (e.g., in the XY plane) of example 3D semiconductor structures 400*a* and 400*b*, in accordance with some implementations of the present disclosure. One or more of 3D semiconductor structures 400*a* and 400*b* can be similar to, or same as, 3D semiconductor device 100 of FIG. 1, or a part of the 3D semiconductor device 100 of FIG. 1 (e.g., the second semiconductor structure 104 of FIG. 1), or a structure at an intermediate fabrication process of the 3D semiconductor device 100 of FIG. 1.

As shown in FIG. 4A, semiconductor structure 400*a* includes four rows of semiconductor bodies. A first row of semiconductor bodies include semiconductor bodies 402*a*, 404*a*, and 406*a*. A second row of semiconductor bodies include semiconductor bodies 402*b*, 404*b*, and 406*b*. A third row of semiconductor bodies include semiconductor bodies 402*c*, 404*c*, and 406*c*. A fourth row of semiconductor bodies include semiconductor bodies 402*d*, 404*d*, and 406*d*. Note that semiconductor structure 400*a* is shown to include three semiconductor bodies in each row of the four rows for illustrative purpose only. In some implementations, semiconductor structure 400*a* includes any suitable number of rows and any suitable number of semiconductor bodies in each row.

Semiconductor structure 400*a* further includes word lines 408*a*, 408*b*, 408*c*, and 408*d*. Each one of word lines 408*a*, 408*b*, 408*c*, and 408*d* is coupled to a respective row of semiconductor bodies. Each one of word lines 408*a*, 408*b*, 408*c*, and 408*d* can be same as, or similar to, the word line 301*a*, 301*b* of FIG. 3A. As shown, word line 408*a* is coupled to the first row of semiconductor bodies including semiconductor bodies 402*a*, 404*a*, and 406*a*. Word line 408*b* is coupled to the second row of semiconductor bodies including semiconductor bodies 402*b*, 404*b*, and 406*b*. Word line 408*c* is coupled to the third row of semiconductor bodies including semiconductor bodies 402*c*, 404*c*, and 406*c*. Word line 408*d* is coupled to the fourth row of semiconductor bodies including semiconductor bodies 402*d*, 404*d*, and 406*d*.

Semiconductor structure 400*a* further includes conductive structures 410*a* and 410*b*. Each one of conductive structures 410*a* and 410*b* is located between two adjacent rows of semiconductor bodies. Each one of conductive structures 410*a* and 410*b* can be same as, or similar to, the conductive structure 308 of FIG. 3A. As shown, conductive structure 410*a* is located between the first row of semiconductor bodies including semiconductor bodies 402*a*, 404*a*, and 406*a* and the second row of semiconductor bodies including semiconductor bodies 402*b*, 404*b*, and 406*b*. Conductive structure 410*b* is located between the third row of semiconductor bodies including semiconductor bodies 402*c*, 404*c*, and 406*c* and the fourth row of semiconductor bodies including semiconductor bodies 402*d*, 404*d*, and 406*d*.

Semiconductor structure 400*a* further includes connection structures 412*a*-412*f*. Each one of connection structures 412*a*-412*f* is coupled to a respective one of word lines or conductive structure. As shown, connection structure 412*a* is coupled to word line 408*a*, connection structure 412*b* is coupled to word line 408*b*, connection structure 412*c* is coupled to conductive structure 410*b*, connection structure 412*d* is coupled to conductive structure 410*a*, connection structure 412*e* is coupled to word line 408*c*, and connection structure 412*f* is coupled to word line 408*d*.

In some implementations, connection structures of semiconductor structure 400*a* are located at different ends of adjacent words lines and conductive structures, e.g., in a same side of the semiconductor structure 400*a*. Connection structures 412*a*-412*f* are arranged such that connection structures 412*a*, 412*b*, and 412*c* are located at one end of a respective word line or conductive structure, and connection structures 412*d*, 412*e*, and 412*f* are located on the other end of a respective word line or conductive structure. In the shown example, connection structure 412*a* is located at an end of word line 408*a* that is closer to semiconductor body 402*a* than the other semiconductor bodies in a same row, and connection structure 412*d* is located at an end of conductive structure 410*a* that is closer to semiconductor body 406 than the other semiconductor bodies in a same row. By arranging the connection structures alternatively on different ends of respective word lines and conductive structures, the overall manufacturing complexity of the semiconductor structure can be reduced.

FIG. 4B illustrates another example 3D semiconductor structure 400*b*, in accordance with some implementations of the present disclosure. Reference numerals and description of elements in FIG. 4B that are similar to those as described with reference to FIG. 4A may be omitted below for brevity.

As shown, semiconductor structure 400*b* includes word lines 422*a*, 422*b*, 422*c*, and 422*d*. Connection structures 424*a*, 424*b*, 424*c*, and 424*d* are coupled to word lines 422*a*, 422*b*, 422*c*, respectively. Semiconductor structure 400*b* includes conductive structures 426*a* and 426*b*. Connection structures 428*a* and 428*b* are coupled to conductive structures 426*a* and 426*b*, respectively.

In some implementations, semiconductor structure 400*b* includes a front side and a back side, spaced along the Z direction, similar to the front side and the back side as described with reference to FIG. 1. In some implementations, connection structures (e.g., connection structures 424*a*-424*d*) coupled to the word lines in semiconductor structure 400*b* are located on the front side of semiconductor structure 400*b*, and connection structures (e.g., connection structures 428*a* and 428*b*) coupled to the conductive structures in semiconductor structure 400*b* are located on the back side of semiconductor structure 400*b*. In some implementations, connection structures coupled to the word lines in semiconductor structure 400*b* are located on the back side of semiconductor structure 400*b*, and connection structures coupled to the conductive structures in semiconductor structure 400*b* are located on the front side of semiconductor structure 400*b*. Adjacent word lines on a same side of the semiconductor structure 400*b* are respectively coupled to connection structures on opposite ends of the semiconductor structure 400*b* on the same side. For example, word line 422*b* is coupled to connection structure 424*b*, and word line 322*c* adjacent to the word line 422*b* is coupled to connection structure 424*c*, where the connection structures 424*b*, 423*c* are on opposite ends of the semiconductor structure 400*b*.

By arranging the connection structures of the word lines and connection structures of the conductive structures on opposite sides of the semiconductor structure, the overall manufacturing complexity of the semiconductor structure can be reduced.

Figure 5:
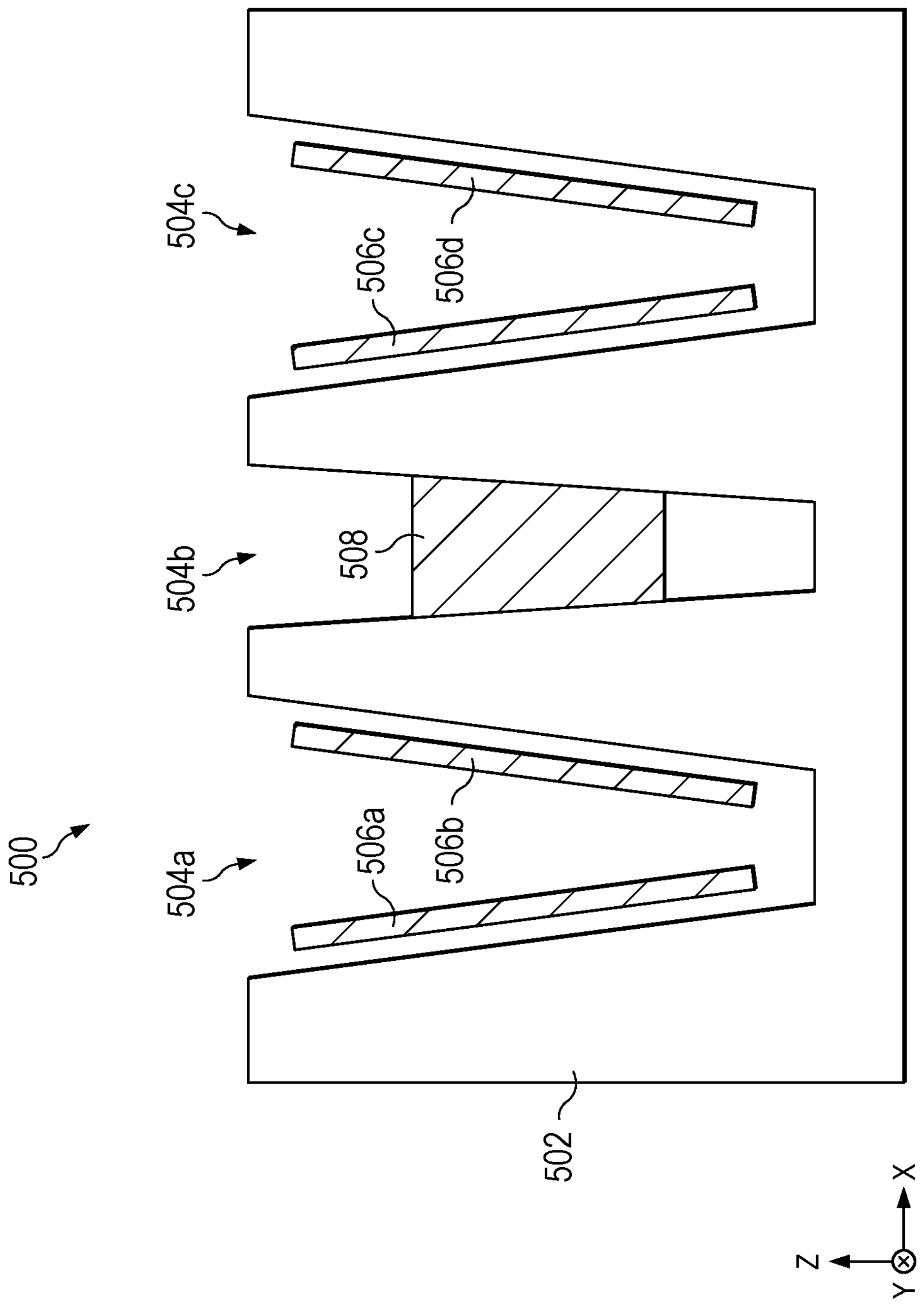
FIG. 5 illustrates a cross-sectional view of an example 3D semiconductor structure.

FIG. 5 illustrates a cross-sectional view (e.g., in the XZ plane) of example 3D semiconductor structure 500, in accordance with some implementations of the present disclosure. Semiconductor structure 500 can be similar to, or same as, 3D semiconductor device 100 of FIG. 1, or a part of the 3D semiconductor device 100 of FIG. 1 (e.g., the second semiconductor structure 104 of FIG. 1), or a structure at an intermediate fabrication process of the 3D semiconductor device 100 of FIG. 1.

As shown, semiconductor structure 500 includes a semiconductor substrate 502 including trenches 504*a*, 504*b*, and 504*c*. Each one of word lines 506*a* and 506*b* is located at a respective side wall of trench 504*a*, and each one of word lines 506*c* and 506*d* is located at a respective side wall of trench 504*c*. As noted above, vertical gate terminals (e.g., 206*a* of FIG. 2A) of vertical transistors in a row of memory cells can be connected together to form a corresponding word line 506*a*, 506*b*, 506*c*, 506*d*. Each word line 506*a*, 506*b*, 506*c*, 506*d* can be same as, or similar to, the word line 301*a*, 301*b* of FIG. 3A. Conductive structure 508 is located inside trench 504*b*. Conductive structure 508 can be same as, or similar to, any suitable conductive structure as described in FIGS. 2A-2H, FIGS. 3A-3E, or FIGS. 4A-4B or any suitable combination thereof.

In some implementations, semiconductor structure 500 includes a front side and a back side, spaced along the Z direction, similar to the front side and the back side as described with reference to FIG. 1. In the shown example, each one of trenches 504*a*, 504*b*, and 504*c* includes an opening on the front side of semiconductor structure 500. In some implementations, word lines 506*a*-506*d* and conductive structure 508 are manufactured from a same side (e.g., front side) of semiconductor structure 500. An example process of manufacturing the word lines and conductive structures from the same side of a semiconductor structure will be discussed below with greater detail with reference to FIGS. 5A-5M.

Figure 5A:
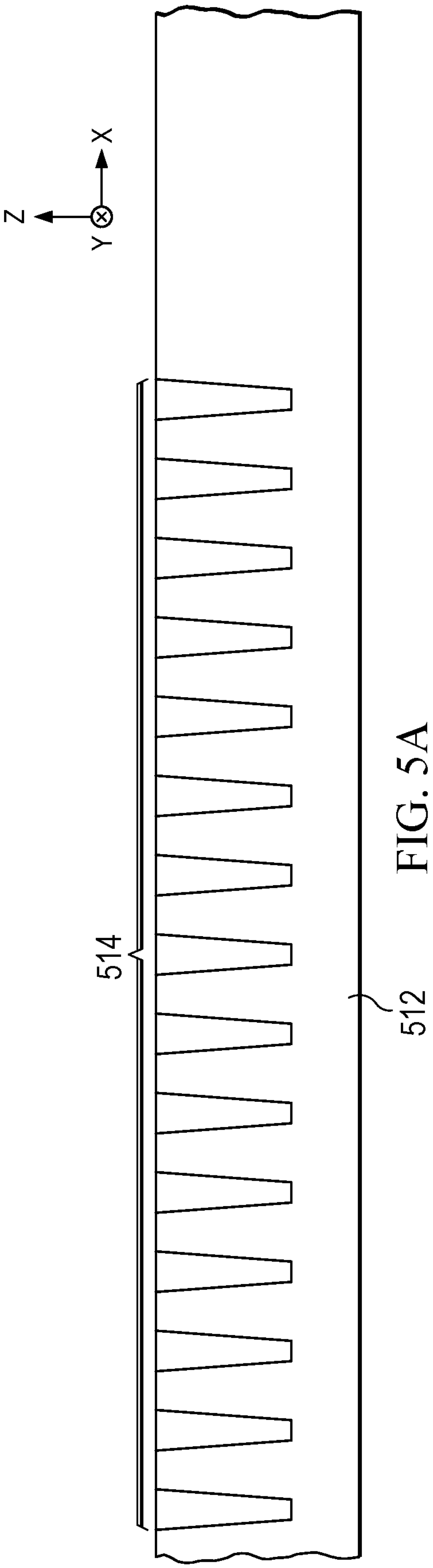
FIGS. 5A-5M illustrate an example process of manufacturing a 3D semiconductor structure.

Semiconductor substrate 512 is provided (FIG. 5A). Semiconductor substrate 512 can include silicon (e.g., single crystalline silicon, c-Si), SiGe, GaAs, Ge, SOI, or any other suitable materials. In some implementations, a doping process is performed on semiconductor substrate 512 to create n-type regions or p-type regions. In some implementations, an atomic absorption process is performed on semiconductor substrate 512 to remove impurities in semiconductor substrate 512.

Semiconductor substrate 512 includes regions 514. In some implementations, each one of regions 514 extends along the Y direction. In some implementations, each one of regions 514 is manufactured by forming trenches from a front side of semiconductor substrate 512 and filling the trenches with an oxide material.

Figure 5B:
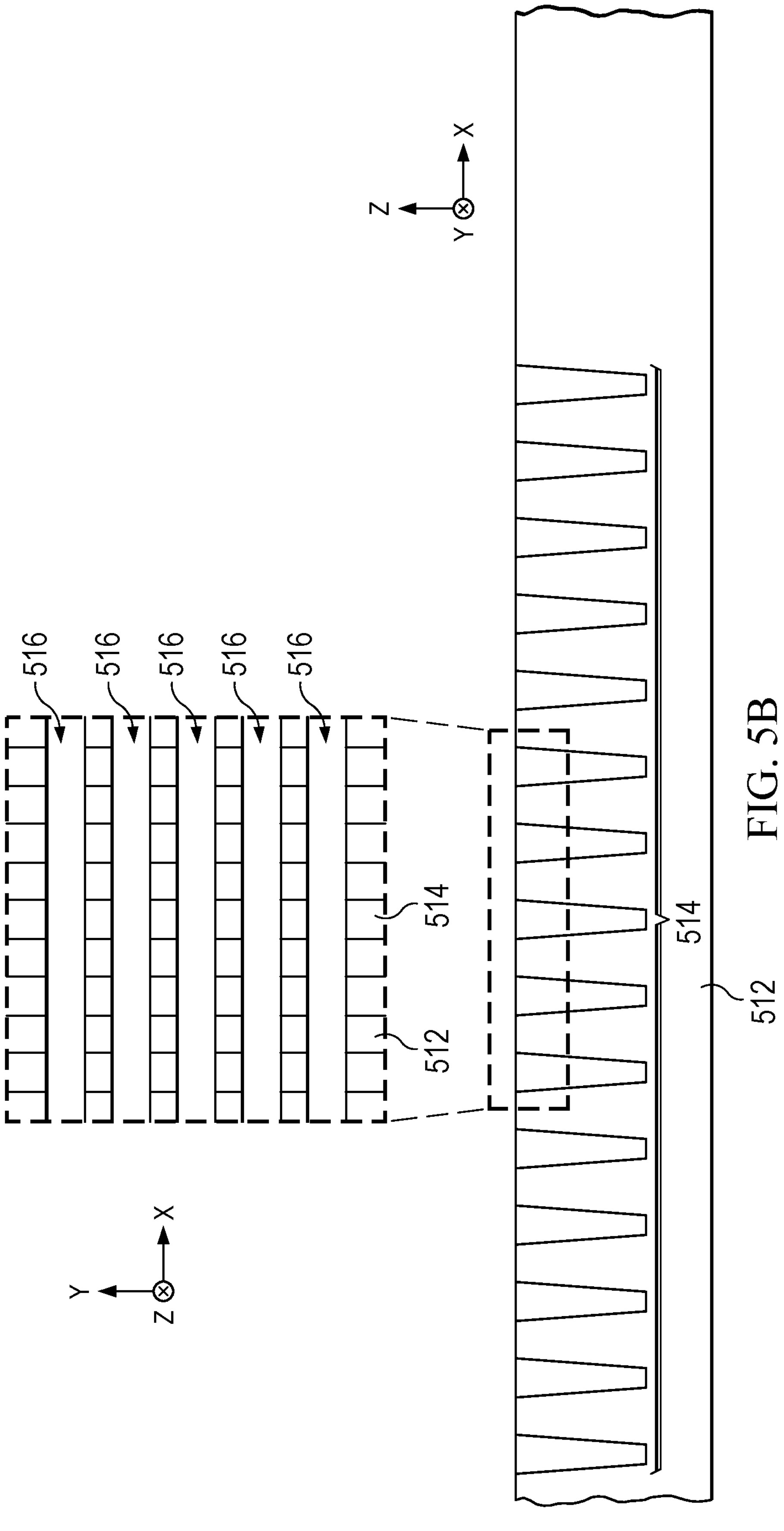

Then, trenches 516 are formed in semiconductor substrate 512 (FIG. 5B). As shown, each one of trenches 516 extends along the X direction. In some implementations, trenches 516 are formed by etching semiconductor substrate 512 along Y direction using a suitable etching method, such as one or more of wet etching, dry etching, reactive ion etching, deep reactive ion etching, plasma etching, or inductively coupled plasma etching, etc. In some implementations, trenches 516 are filled with an oxide material.

Figure 5C:
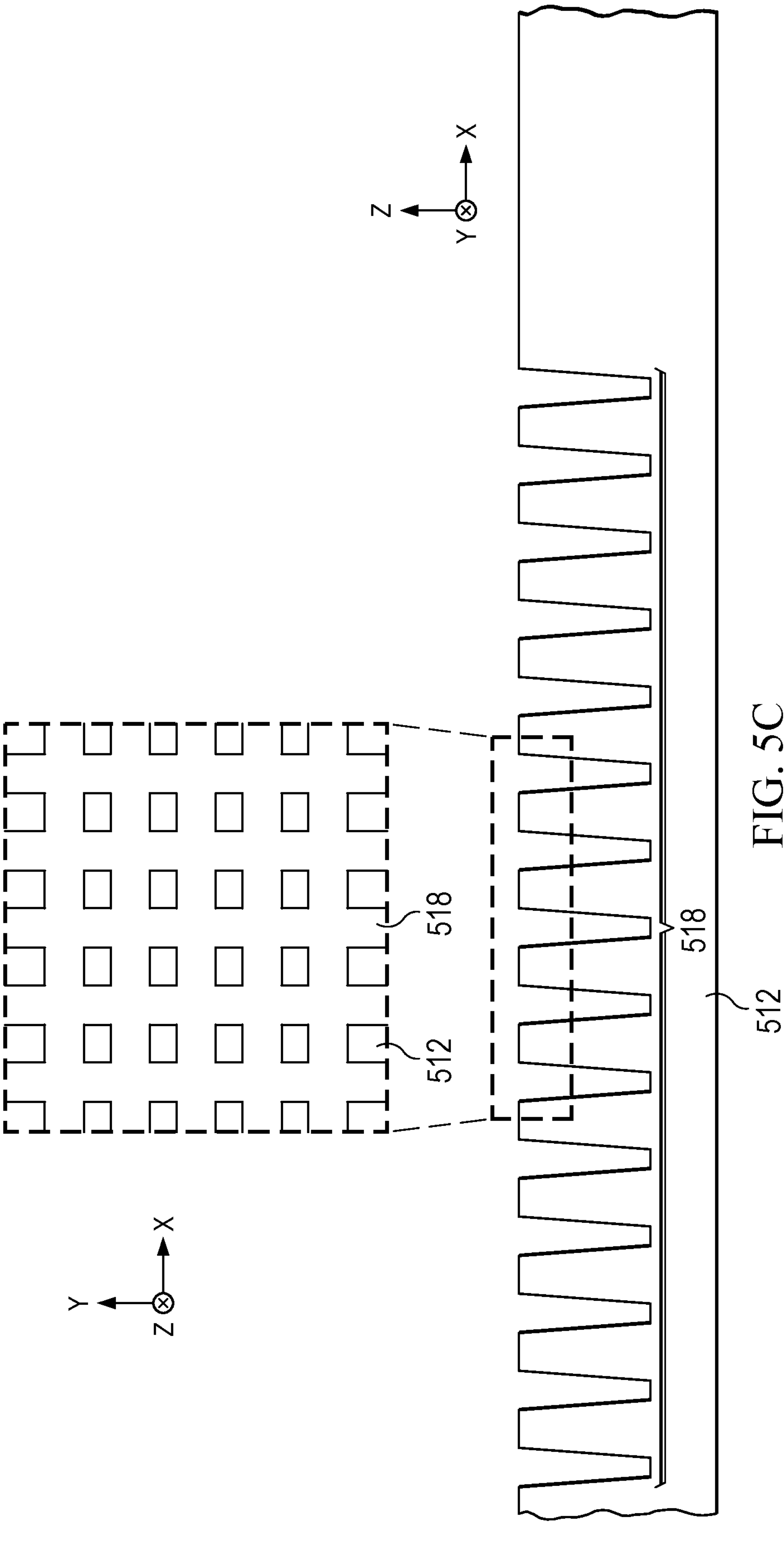

Next, a number of trenches 518 are formed in semiconductor substrate 512 (FIG. 5C). Trenches 518 can include multiple trenches 518, where each one of trenches 518 extends along the X direction. In some implementations, trenches 518 can be formed by etching a front side of semiconductor substrate 512.

Figure 5D:
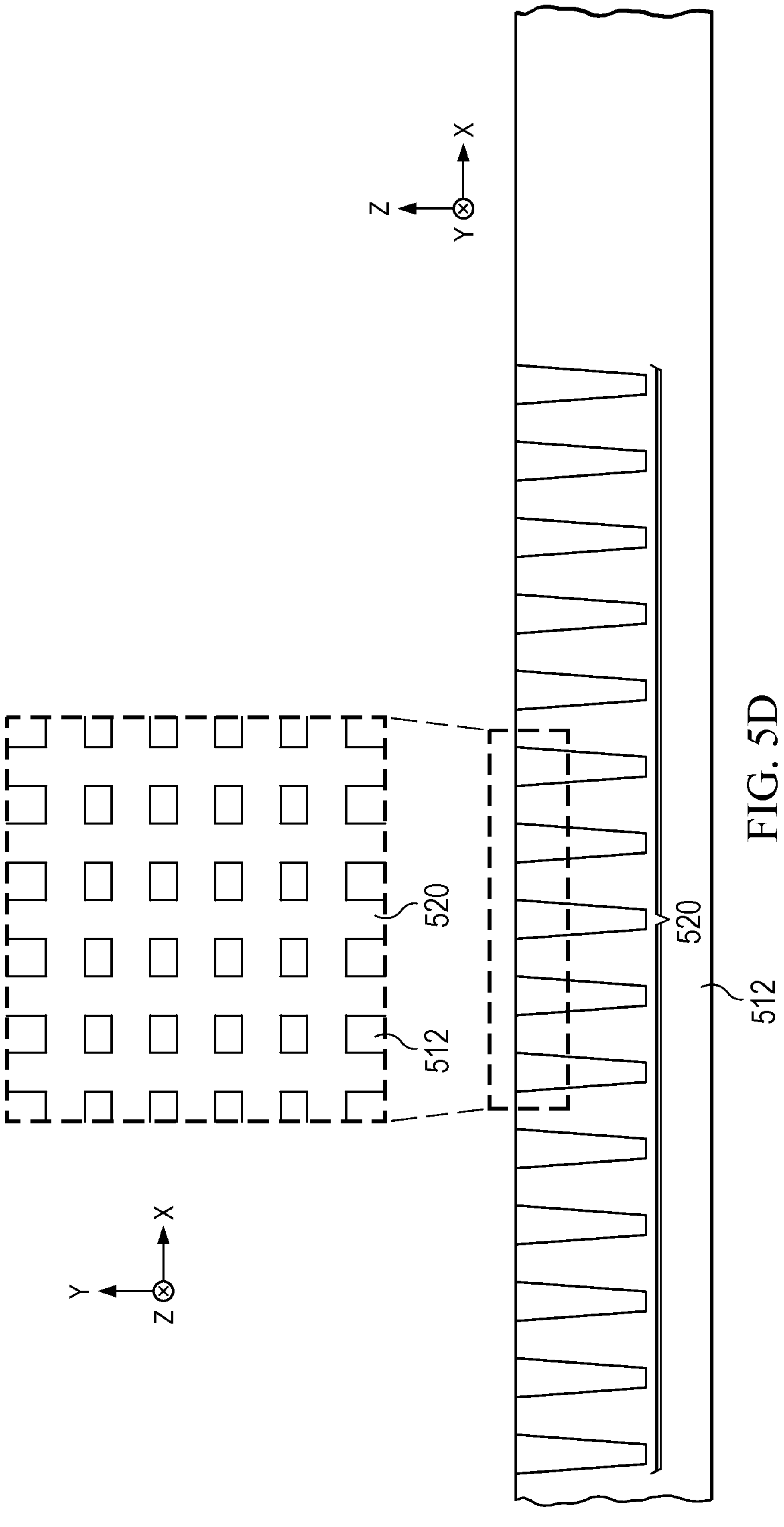
Figure 5E:
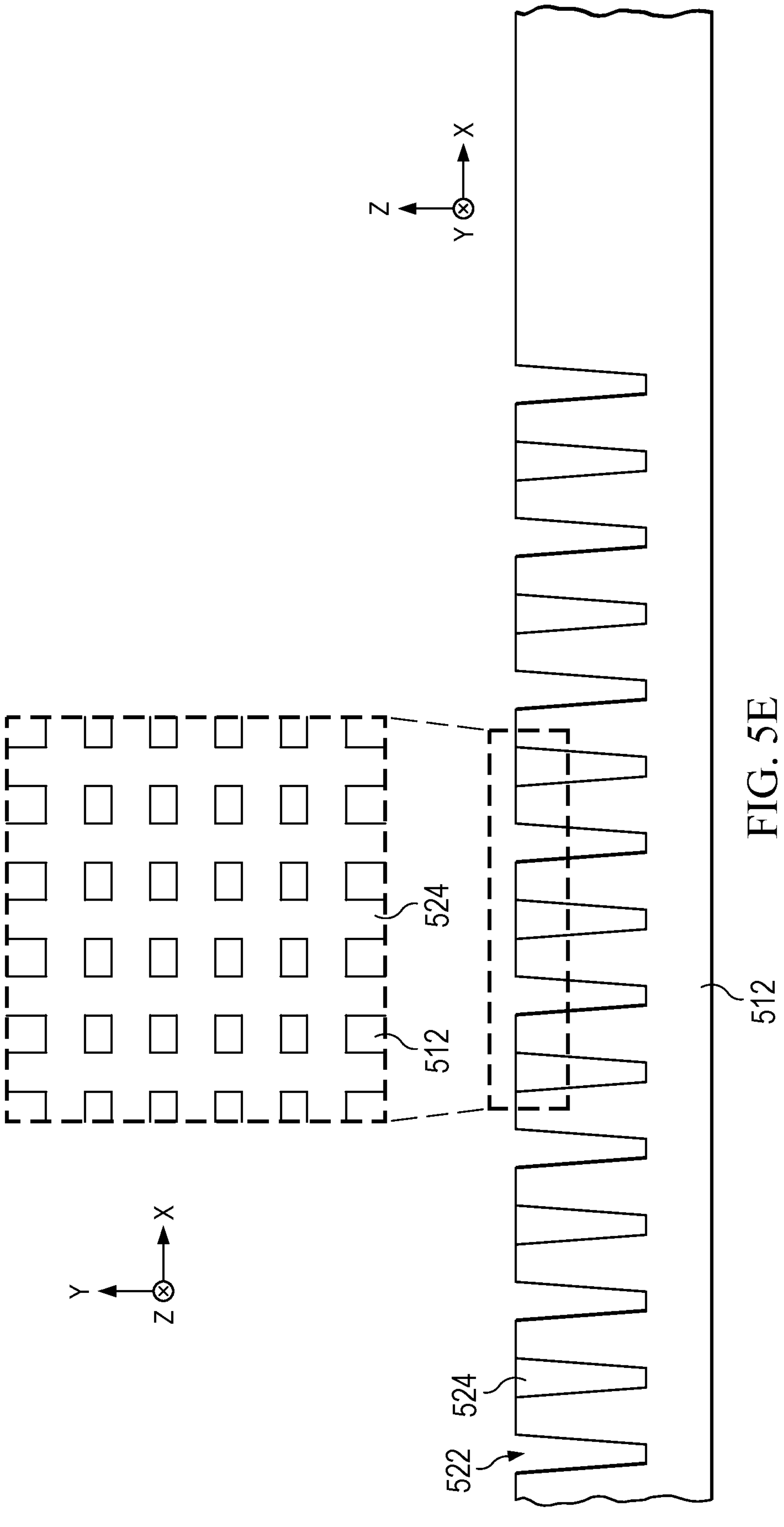
Figure 5F:
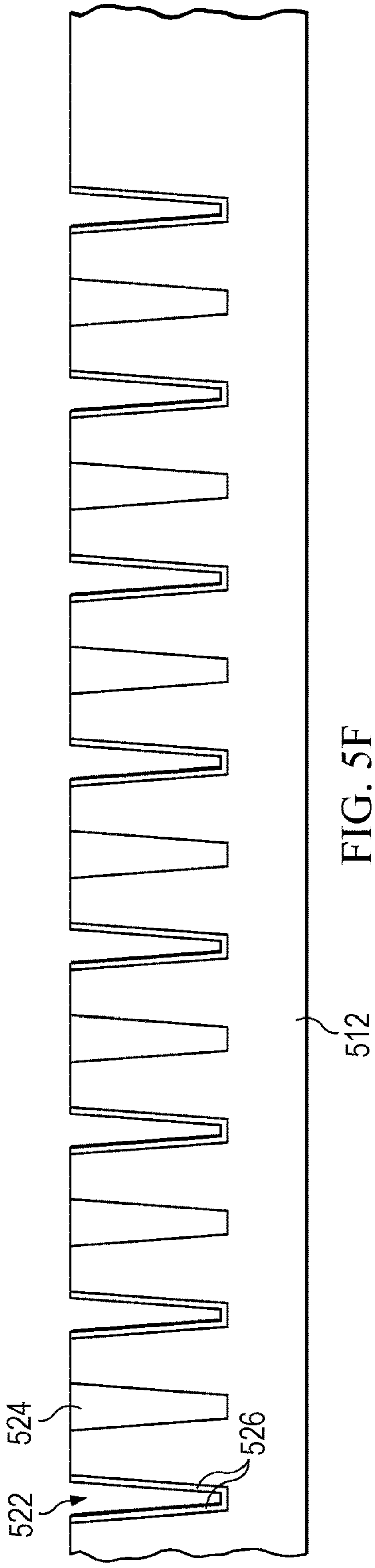
Figure 5G:
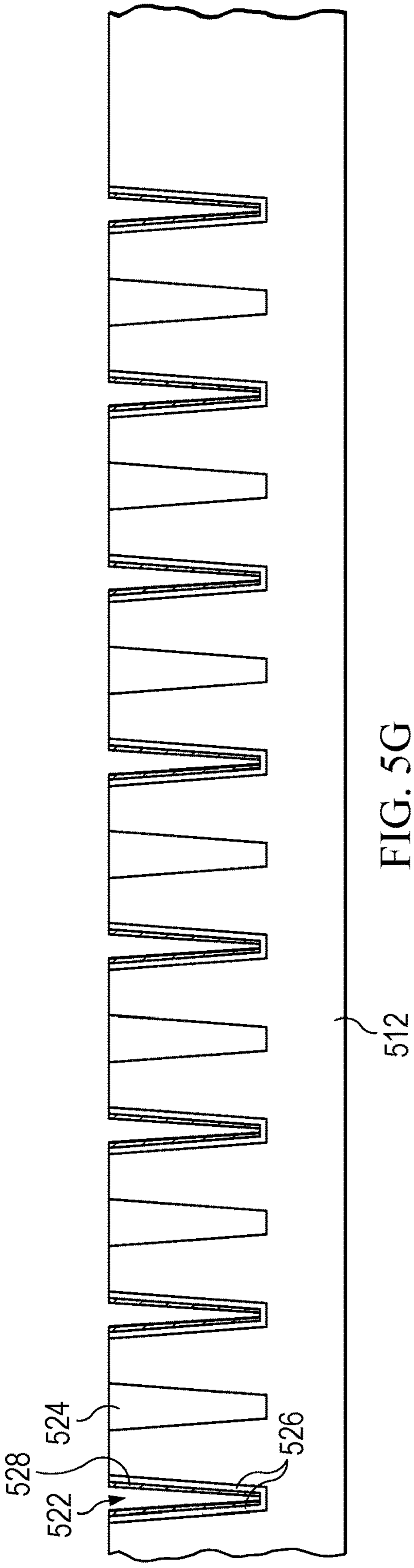
Figure 5H:
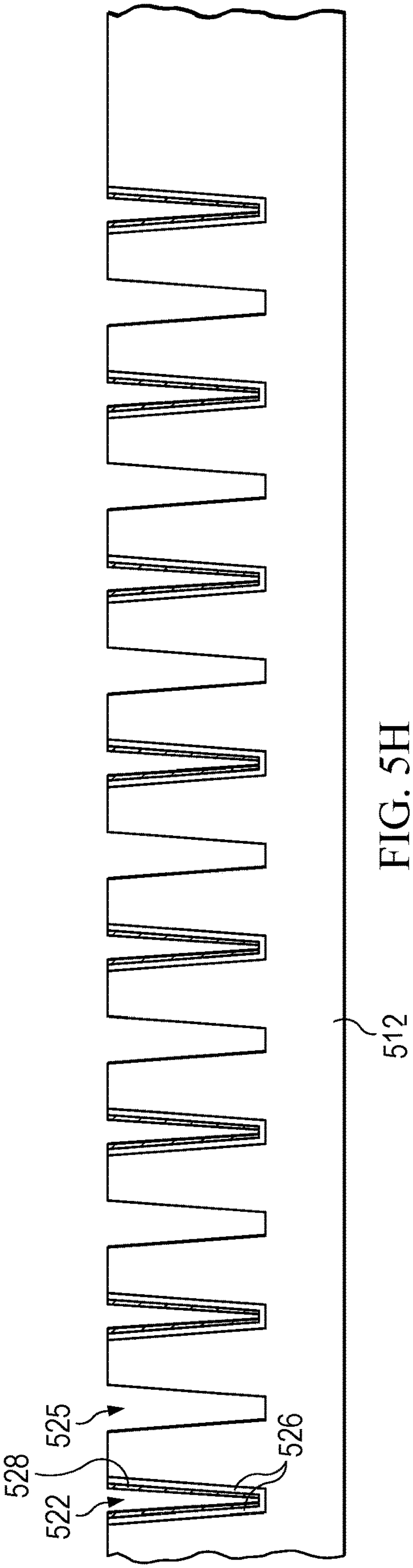
Figure 5I:
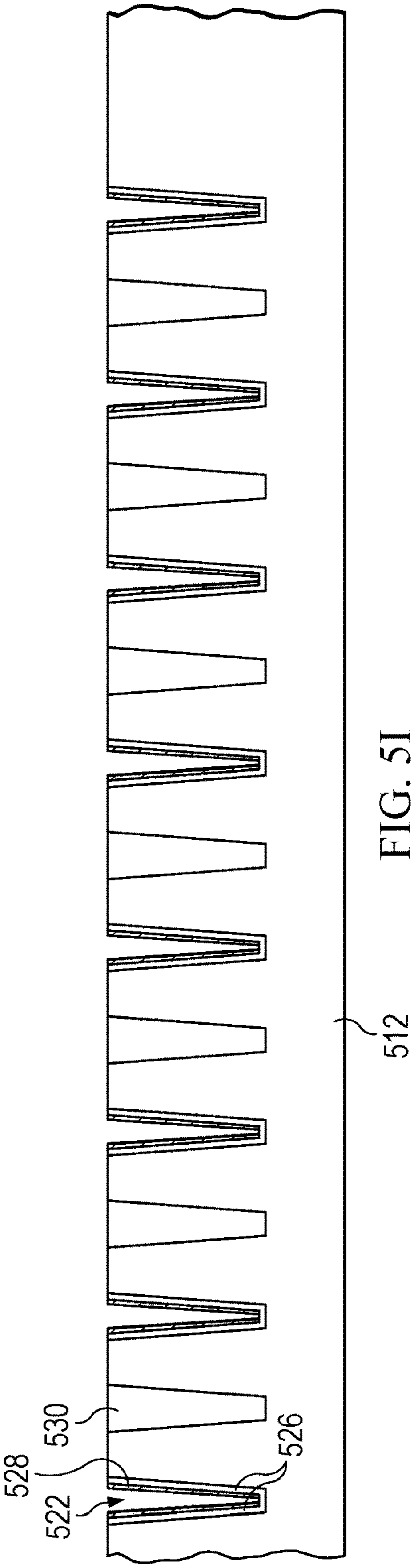
Figure 5J:
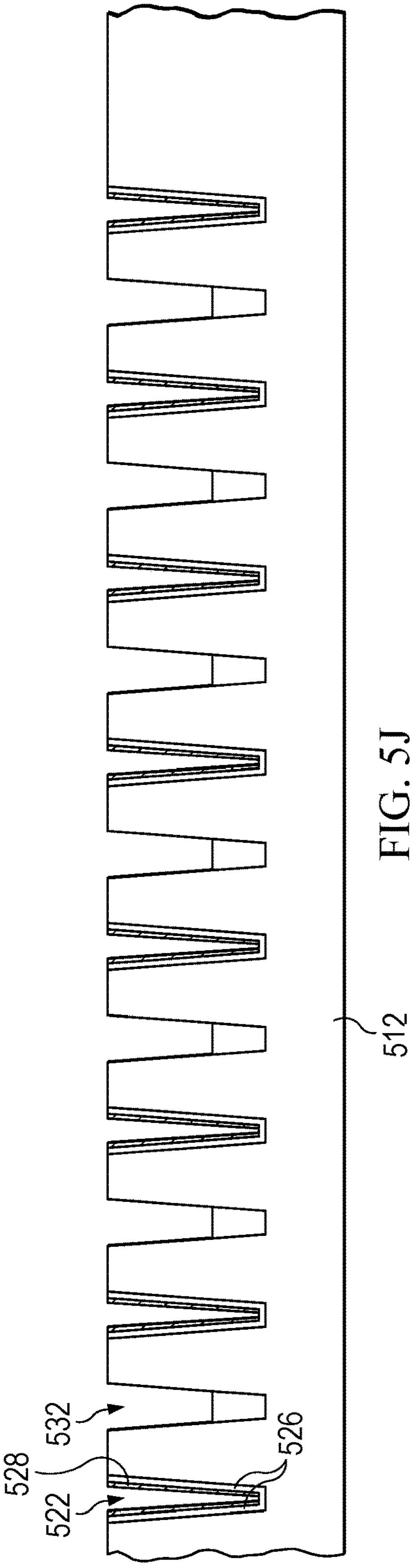
Figure 5K:
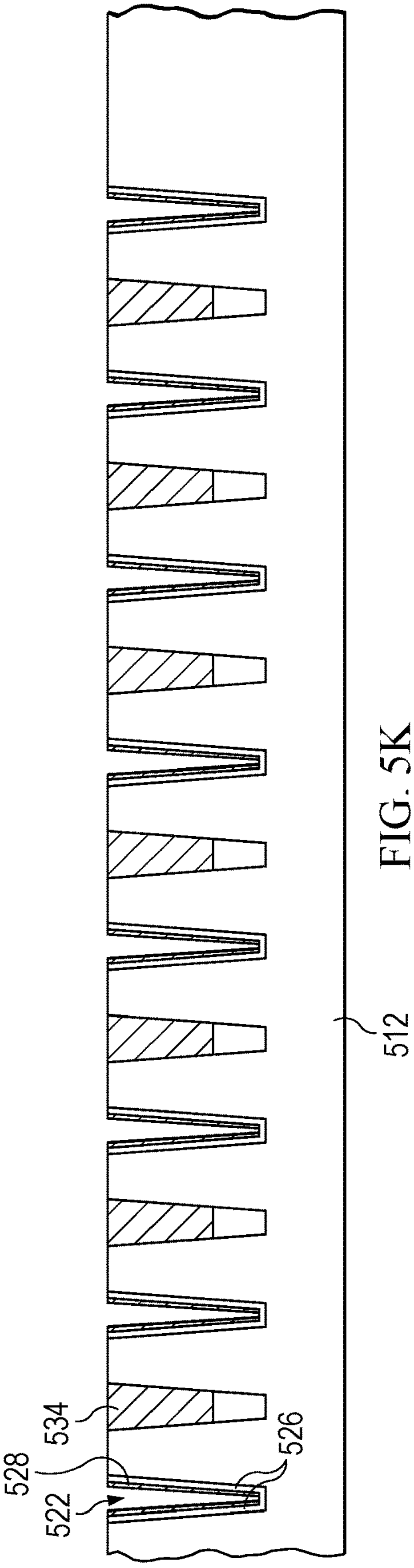
Figure 5L:
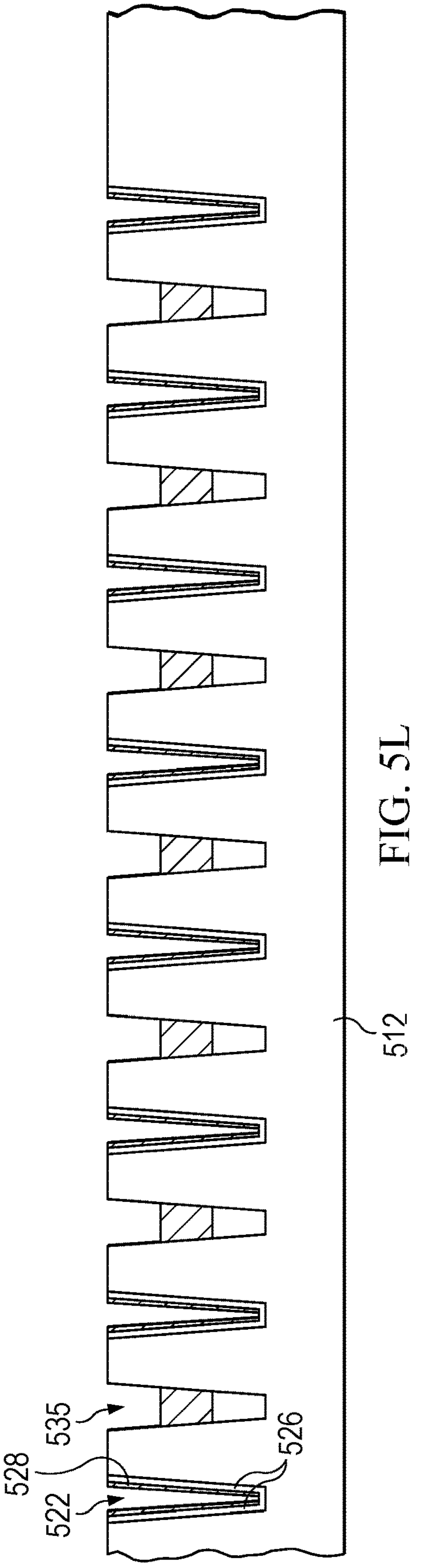
Figure 5M:
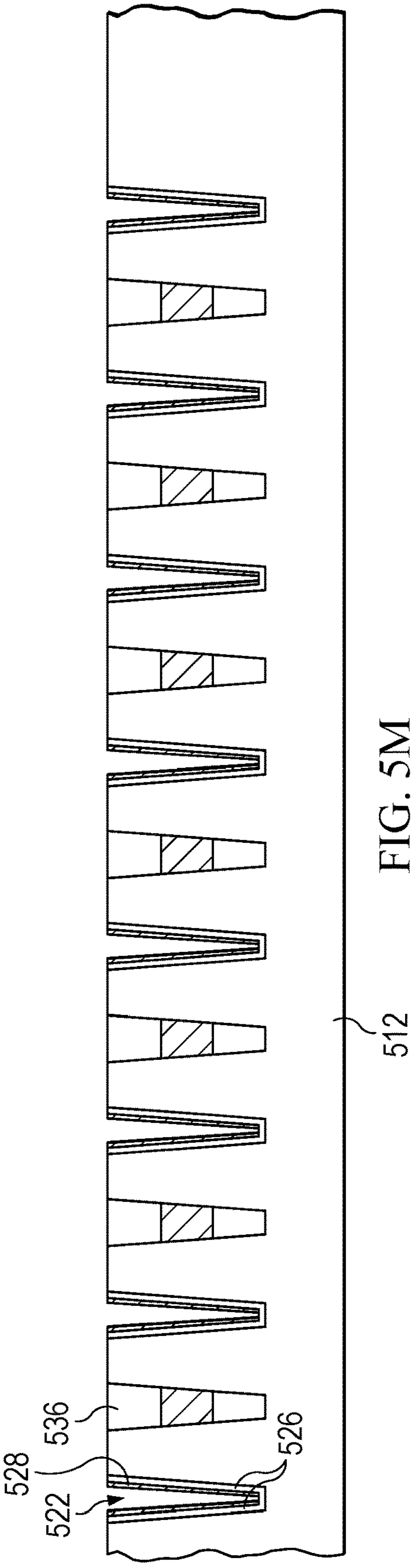

An oxide material is used to fill trenches 518 to form regions 520 (FIG. 5D). A subset of regions 520 are etched to remove an oxide material filling the subset set of regions 520, such that a pattern of alternatively arranged trenches 522 and filled trenches 524 is formed (FIG. 5E). Then, gate dielectric 526 is formed on the side walls of trenches 522 by, e.g., depositing an oxide material (FIG. 5F). Gate electrodes 528 are formed adjacent to gate dielectric 526 in trenches 522 (FIG. 5G). Gate electrodes 528 of vertical transistors of a row of memory cells are connected together to form a corresponding word line (e.g., 506*a*, 506*b*, 506*c*, or 506*d*). Filled trenches 524 are etched to remove the filling oxide to form trenches 525 (FIG. 5H). Trenches 525 are subsequently filled with an oxide material to form filled trenches 530 (FIG. 5I). Filled trenches 530 are etched to remove a part of the oxide material filling the trenches to form partially filled trenches 532 (FIG. 5J). A conductive material is used to fill partially filled trenches 532, to form filled trenches 534 (FIG. 5K). The conductive material forms a conductive structure (e.g., conductive structure 508 of FIG. 5). Then, filled trenches 532 are etched to remove a portion of the conductive material in the filled trenches 534, to form partially filled trenches 535 that include a remaining portion of the conductive material (FIG. 5L). Next, an oxide material is used to fill partially filled trenches 535 to form filled trenches 536 (FIG. 5M).

Figure 6:
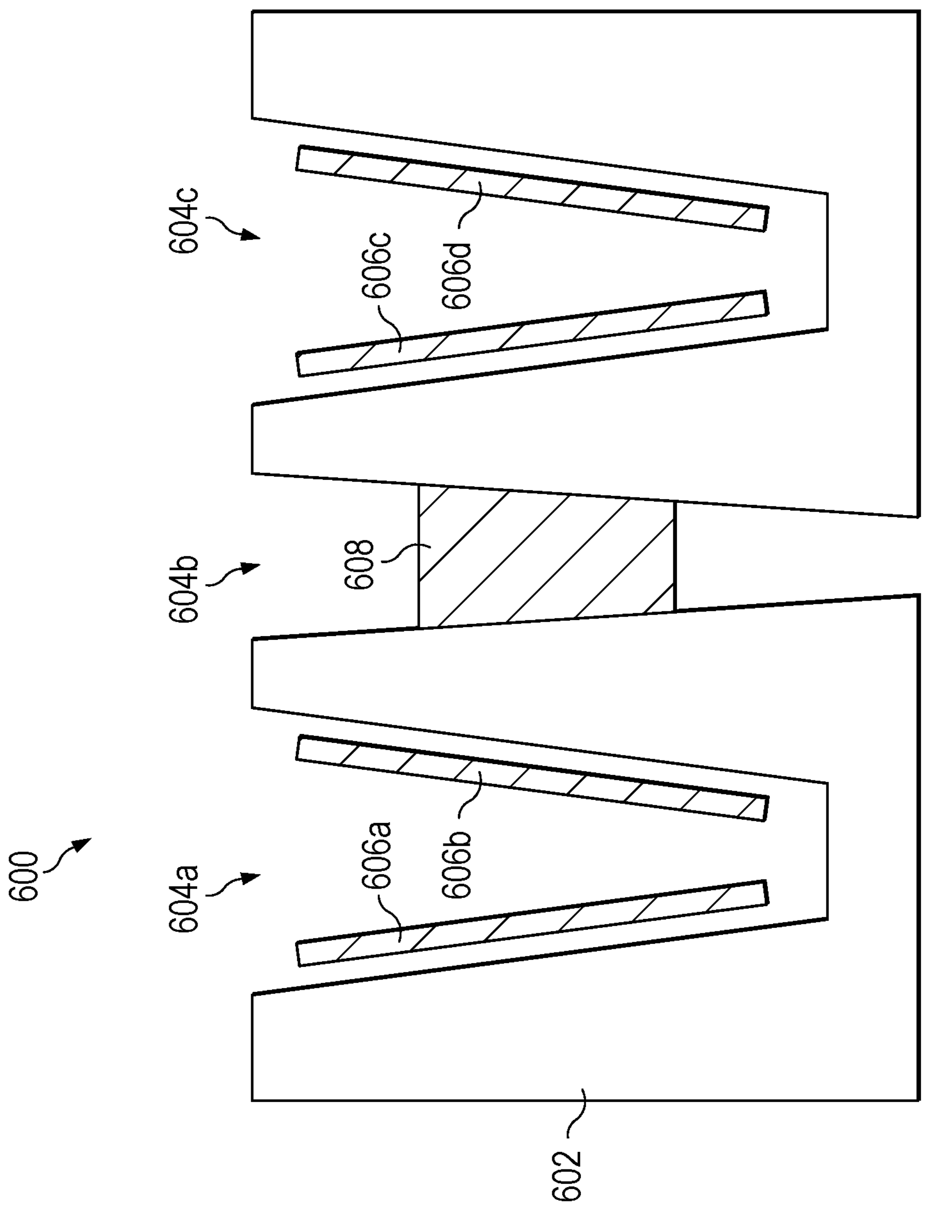
FIG. 6 illustrates a cross-sectional view of another example 3D semiconductor structure.

In some implementations, word lines and conductive structure are manufactured from opposite sides of a semiconductor structure. Referring to FIG. 6, in some examples, word lines 606*a*-606*d* and conductive structure 608 can be manufactured from opposite sides of semiconductor structure 600. In some examples, word lines 606*a*-606*d* can be manufactured from a front side of semiconductor structure 600, and conductive structure 608 can be manufactured from a back side of semiconductor structure 600. For example, the word lines 604*a*-606*d* can be formed in trenches 604*a*, 604*c* formed in semiconductor substrate 602 (e.g., 502 of FIG. 5), while conductive structure 608 can be formed in a middle trench 604*b* between the trenches 604*a*, 604*c*. In some implementations, after components (e.g., vertical transistors, word lines, and/or capacitors) in a front side of semiconductor substrate 602 is fabricated, a back side of semiconductor substrate 602 can be thinned and/or polished (e.g., by CMP). Then, the back side of semiconductor substate 602 can be etched until to the middle trench 604*b*. An isolating material can be first formed in the middle trench 604*b* from the back side of semiconductor substrate 602, and then a conductive material can be deposited on the isolating material in the middle trench 604*b* from the back side of semiconductor substate 602. Then the filled conductive material is recessed from the back side semiconductor substrate 602 to form the conductive structure 608. Finally, an isolating material can be further formed on the conductive structure 608 from the back side of semiconductor substrate 602.

Figure 7:
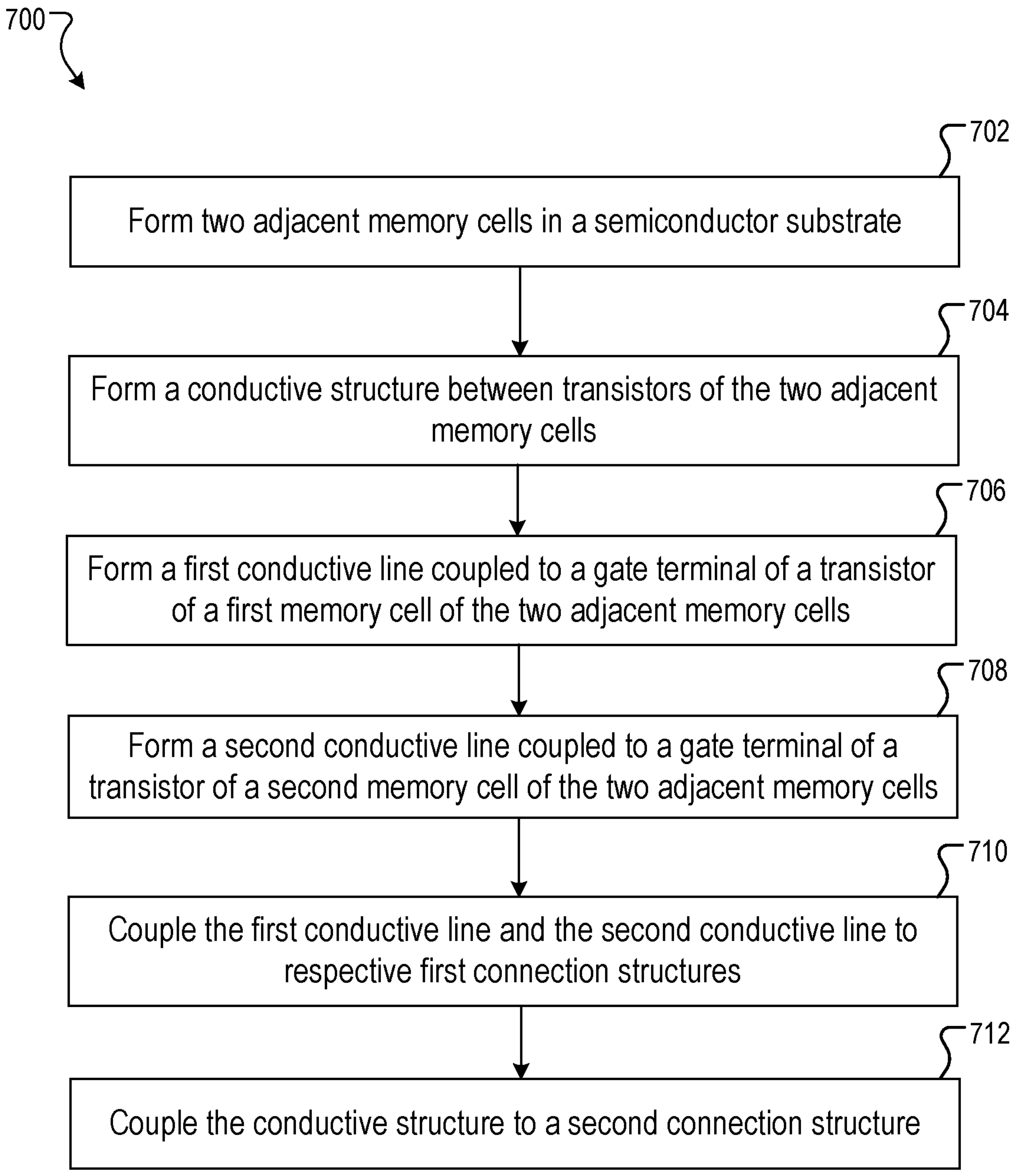
FIG. 7 illustrates a flow chart of an example process of manufacturing a semiconductor structure.

FIG. 7 illustrates a flow chart of an example process 700 of manufacturing a semiconductor structure. In some implementations, process 700 starts when two adjacent memory cells (e.g., memory cells 207*a* and 207*b*) are formed in a semiconductor substrate (e.g., substrate 502) (702). In some implementations, each of the two adjacent memory cells includes a transistor (e.g., transistor 209*a*) having a semiconductor body (e.g., semiconductor body 201*a*), a first terminal (e.g., terminal 202*a*), a second terminal (e.g., terminal 203*a*), and a gate terminal (e.g., gate terminal 212*a*). In some implementations, the two adjacent memory cells are formed from a first side of the semiconductor substrate, and the conductive structure is formed from a second side of the semiconductor substrate, where the second side is opposite to the first side.

A conductive structure (e.g., conductive structure 208) is formed between transistors of the two adjacent memory cells (704). In some implementations, the conductive structure is in contact with at least one of semiconductor bodies of the transistors of the two adjacent memory cells. In some implementations, the conductive structure is spaced from the first terminal and the second terminal of each of the transistors of the two adjacent memory cells.

A first conductive line (e.g., word line 408*a*) is formed and coupled to the gate terminal of the transistor of a first memory cell of the two adjacent memory cells (706). A second conductive line (e.g., word line 408*b*) is formed and coupled to the gate terminal of the transistor of a second memory cells of the two adjacent memory cells (708). The first conductive line and the second conductive line are coupled to respective first connection structures (e.g., connection structures 412*a* and 412*b*) (710). The conductive structure is coupled to a second connection structure (e.g., connection structure 412*d*) (712).

Figure 8:
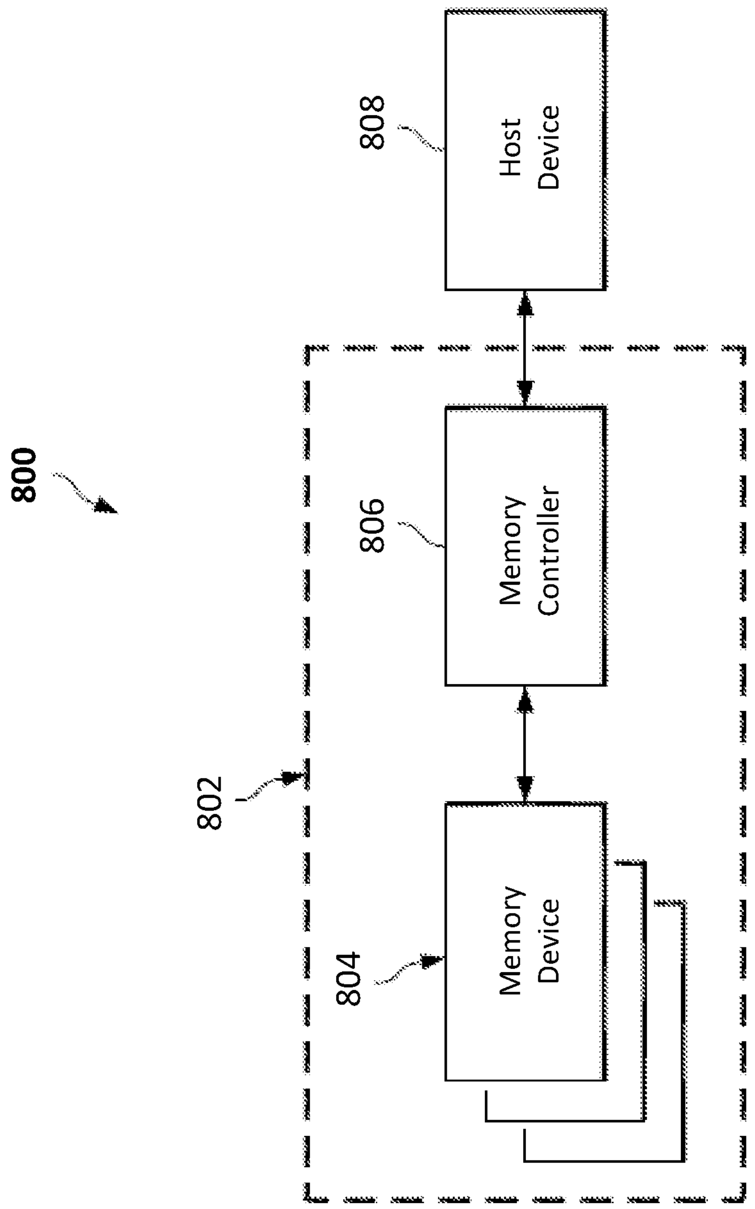
FIG. 8 illustrates a block diagram of an example system having one or more semiconductor devices.

FIG. 8 illustrates a block diagram of a system 800 having one or more semiconductor devices (e.g., memory devices), according to one or more implementations of the present disclosure. The system 800 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 8, the system 800 can include a host device 808 and a memory system 802 having one or more 3D memory devices 804 and a memory controller 806. Host device 808 can include a processor of an electronic device, such as a central processing unit (CPU), or a system-on-chip (SoC), such as an application processor (AP). Host device 808 can be configured to send or receive data to or from the one or more 3D memory devices 804.

A 3D memory device 804 can be any 3D memory device disclosed herein, such as 3D memory device depicted in FIG. 1. In some implementations, a 3D memory device 804 includes a NAND Flash memory. Memory controller 806 (a.k.a., a controller circuit) is coupled to 3D memory device 804 and host device 808. Consistent with implementations of the present disclosure, 3D memory device 804 can include a plurality of conductive interconnections through a cover layer that are in contact with conductive pads in a conductive pad layer, and memory controller 806 can be coupled to 3D memory device 804 through at least one of the plurality of conductive interconnections. Memory controller 806 is configured to control 3D memory device 804. For example, memory controller 806 may be configured to operate a plurality of channel structures via word lines. Memory controller 806 can manage data stored in 3D memory device 804 and communicate with host device 808.

In some implementations, memory controller 806 is designed/configured for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 606 is designed/configured for operating in a high duty cycle environment SSDs or embedded multi-media-cards (eMMCs) used as data storage for mobile devices, such as smartphones, tablets, laptop computers, etc., and enterprise storage arrays. Memory controller 806 can be configured to control operations of 3D memory device 804, such as read, erase, and program (or write) operations. Memory controller 806 can also be configured to manage various functions with respect to the data stored or to be stored in 3D memory device 804 including, but not limited to bad-block management, garbage collection, logical-to-physical address conversion, wear leveling, etc. In some implementations, memory controller 806 is further configured to process error correction codes (ECCs) with respect to the data read from or written to 3D memory device 804. Any other suitable functions may be performed by memory controller 806 as well, for example, formatting 3D memory device 804.

Memory controller 806 can communicate with an external device (e.g., host device 808) according to a particular communication protocol. For example, memory controller 806 may communicate with the external device through at least one of various interface protocols, such as a USB protocol, an MMC protocol, a peripheral component interconnection (PCI) protocol, a PCIexpress (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 806 and one or more 3D memory devices 804 can be integrated into various types of storage devices, for example, be included in the same package, such as a universal Flash storage (UFS) package or an eMMC package. That is, memory system 802 can be implemented and packaged into different types of end electronic products. In one example as shown in FIG. 8, memory controller 806 and a single 3D memory device 804 may be integrated into a memory card 802. Memory card 802 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc.

Implementations of the subject matter and the actions and operations described in this present disclosure can be implemented in digital electronic circuitry, in tangibly-embodied computer software or firmware, in computer hardware, including the structures disclosed in this present disclosure and their structural equivalents, or in combinations of one or more of them. Implementations of the subject matter described in this present disclosure can be implemented as one or more computer programs, e.g., one or more modules of computer program instructions, encoded on a computer program carrier, for execution by, or to control the operation of, data processing apparatus. The carrier may be a tangible non-transitory computer storage medium. Alternatively, or in addition, the carrier may be an artificially-generated propagated signal, e.g., a machine-generated electrical, optical, or electromagnetic signal, that is generated to encode information for transmission to suitable receiver apparatus for execution by a data processing apparatus. The computer storage medium can be or be part of a machine-readable storage device, a machine-readable storage substrate, a random or serial access memory device, or a combination of one or more of them. A computer storage medium is not a propagated signal.

It is noted that references in the present disclosure to "one embodiment," "an embodiment," "an example embodiment," "some implementations," "some implementations," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other implementations whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically noN+ conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. As used herein, the range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., .+-. 10%, .+-. 20%, or .+-. 30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

The present disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include implementations in which the first and second features may be in direct contact, and may also include implementations in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various implementations and/or configurations discussed.

The foregoing description of the specific implementations can be readily modified and/or adapted for various applications. Therefore, such adaptations and modifications are intended to be within the meaning and range of equivalents of the disclosed implementations, based on the teaching and guidance presented herein.

While the present disclosure contains many specific implementation details, these should not be construed as limitations on the scope of what is being claimed, which is defined by the claims themselves, but rather as descriptions of features that may be specific to particular implementations of particular inventions. Certain features that are described in this present disclosure in the context of separate implementations can also be implemented in combination in a single embodiment. Conversely, various features that are described in the context of a single embodiment can also be implemented in multiple implementations separately or in any suitable sub-combination. Moreover, although features may be described above as acting in certain combinations and even initially be claimed as such, one or more features from a claimed combination can in some cases be excised from the combination, and the claim may be directed to a sub-combination or variation of a sub-combination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations also are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The breadth and scope of the present disclosure should not be limited by any of the above-described exemplary implementations, but should be defined only in accordance with the following claims and their equivalents.

What is claimed is:

1. A semiconductor device, comprising:

two adjacent memory cells, wherein each of the two adjacent memory cells comprises a transistor having a semiconductor body, a first terminal, a second terminal, and a gate terminal; and a conductive structure between transistors of the two adjacent memory cells, the conductive structure being in contact with at least one of semiconductor bodies of the transistors of the two adjacent memory cells, wherein the conductive structure is spaced from the first terminal and the second terminal of each of the transistors of the two adjacent memory cells.

2. The semiconductor device of claim 1, wherein a working function of the conductive structure is higher than a working function of a semiconductor body in contact with the conductive structure.

3. The semiconductor device of claim 1, wherein the conductive structure comprises one or more conductive layers that comprise at least one of a metallic layer, a polysilicon layer, a germanium-silicon (GeSi) layer, or a barrier layer.

4. The semiconductor device of claim 1, wherein the conductive structure is contact with each of the semiconductor bodies of the transistors of the two adjacent memory cells.

5. The semiconductor device of claim 1, wherein the semiconductor body comprises opposite ends along a first direction and opposite sides along a second direction perpendicular to the first direction, wherein the first terminal and the second terminal are at the opposite ends of the semiconductor body along the first direction, respectively, and wherein the gate terminal and the conductive structure are at two opposite sides of the semiconductor body, respectively.

6. The semiconductor device of claim 5, wherein the conductive structure is in contact with at least one of:

a first part of the semiconductor body closer to the first terminal than the second terminal, a second part of the semiconductor body closer to the second terminal than the first terminal, a middle part of the semiconductor body between the first part and the second part, or the first part, the second part, and the middle part of the semiconductor body.

7. The semiconductor device of claim 5, wherein the conductive structure has a first part along the first direction and a second part crossing with the first part along the second direction, and wherein the second part of the conductive structure is in contact with the each of the semiconductor bodies of the transistors of the two adjacent memory cells.

8. The semiconductor device of claim 5, wherein the conductive structure comprises conductive bars spaced along the first direction, each of the conductive bars being in contact with the at least one of the semiconductor bodies along the second direction.

9. The semiconductor device of claim 5, wherein the conductive structure comprises two conductors that are spaced from each other along the second direction, each of the two conductors being in contact with a respective one of the semiconductor bodies of the transistors of the two adjacent memory cells.

10. The semiconductor device of claim 5, wherein the conductive structure comprises an oval shape having edges in contact with the at least one of the semiconductor bodies along the second direction.

11. The semiconductor device of claim 5, comprising:

two word lines spaced along the second direction, wherein each of the two word lines is coupled to a respective memory cell of the two adjacent memory cells, wherein each word line extends in a third direction perpendicular to the first direction and the second direction, and two rows of memory cells, wherein each row of memory cells extends along the third direction and is coupled to a respective word line of the two word lines.

12. The semiconductor device of claim 11, wherein the conductive structure extends along the third direction and has opposite sides along the second direction, and wherein the two rows of memory cells are coupled to the opposite sides of the conductive structure, respectively.

13. The semiconductor device of claim 12, wherein the conductive structure comprises:

a first part extending along the third direction and being coupled to semiconductor bodies of the two rows of the memory cells along the second direction, and one or more second parts extending along the second direction, each of the one or more second parts being between adjacent semiconductor bodies along the third direction.

14. The semiconductor device of claim 12, wherein the conductive structure comprises a first conductor and a second conductor spaced from each other along the second direction, and wherein the first conductor is coupled to a first row of the two rows of memory cells, and the second conductor is coupled to a second row of the two rows of memory cells.

15. The semiconductor device of claim 14, wherein:

the first conductor comprises:

a first part extending along the third direction and being coupled to semiconductor bodies of the first row of the two rows of the memory cells along the second direction, and one or more second parts extending along the second direction, each of the one or more second parts being between adjacent semiconductor bodies along the third direction, and the second conductor comprises:

a third part extending along the third direction and being coupled to semiconductor bodies of the second row of the two rows of the memory cells along the second direction, and one or more fourth parts extending along the second direction, each of the one or more fourth parts being between adjacent semiconductor bodies along the third direction.

16. The semiconductor device of claim 12, wherein the conductive structure comprises a plurality of conductors spaced from one another along the third direction, and wherein each of the plurality of conductors is in coupled to corresponding adjacent memory cells along the second direction.

17. The semiconductor device of claim 12, wherein each of the word lines is coupled to a first connection structure located relatively closer to a first memory cell of a respective row of memory cells than a last memory cell of the respective row of memory cells along the third direction, and wherein the conductive structure is coupled to a second connection structure located relatively closer to the last memory cell of the respective row of memory cells than the first memory cell of the respective row of memory cells.

18. The semiconductor device of claim 12, comprising a semiconductor substrate having first and second opposite sides, wherein each of the word lines is coupled to a first connection structure located at the first side of the semiconductor substrate, and wherein the conductive structure is coupled to a second connection structure located at the second side of the semiconductor substrate.

19. A method of forming a semiconductor device, comprising:

forming two adjacent memory cells in a semiconductor substrate, wherein each of the two adjacent memory cells comprises a transistor having a semiconductor body, a first terminal, a second terminal, and a gate terminal; and forming a conductive structure between transistors of the two adjacent memory cells, the conductive structure being in contact with at least one of semiconductor bodies of the transistors of the two adjacent memory cells, wherein the conductive structure is spaced from the first terminal and the second terminal of each of the transistors of the two adjacent memory cells.

20. A semiconductor device, comprising:

two adjacent semiconductor bodies;

a conductive structure between the two adjacent semiconductor bodies, the conductive structure being in contact with at least one of the two adjacent semiconductor bodies, and two conductive lines on opposite sides of the conductive structure, wherein each of the two conductive lines is coupled to a respective connection structure at an end of the conductive line, wherein the conductive structure is coupled to a corresponding connection structure at an end of the conductive structure, and wherein two adjacent of the respective connection structures coupled to the two conductive lines and the corresponding connection structure coupled to the conductive structure are at: at least one of opposite ends on a same side of the semiconductor device or opposite sides of the semiconductor device.

* * * * *